US010651876B1

(12) United States Patent
Perez et al.

(10) Patent No.: US 10,651,876 B1
(45) Date of Patent: May 12, 2020

(54) SYSTEM AND METHOD FOR DIVIDING THE CARRIER CENTER FREQUENCY OF AN RF MODULATED SIGNAL BY A NON-INTEGER DIVISOR

(71) Applicant: Innophase, Inc., San Diego, CA (US)

(72) Inventors: Roc Berenguer Perez, San Diego, CA (US); Yang Xu, San Diego, CA (US)

(73) Assignee: Innophase Inc., San Diego, CA (US)

( * ) Notice: Subject to any disclaimer, the term of this patent is extended or adjusted under 35 U.S.C. 154(b) by 0 days.

(21) Appl. No.: 16/439,412

(22) Filed: Jun. 12, 2019

(51) Int. Cl.
*H03L 7/099* (2006.01)
*H04B 1/04* (2006.01)
*H03L 7/197* (2006.01)

(52) U.S. Cl.
CPC ............... *H04B 1/04* (2013.01); *H03L 7/099* (2013.01); *H03L 7/1974* (2013.01)

(58) Field of Classification Search
CPC ... H03L 7/1976; H03L 7/0995; H03L 7/0992; H03L 7/099; H03L 7/08; H03L 7/085; H03L 7/1974; H03L 7/06; H04B 1/04
USPC .................. 375/156, 295–296, 371, 376, 300
See application file for complete search history.

(56) References Cited

U.S. PATENT DOCUMENTS

| | | | |
|---|---|---|---|
| 3,813,610 A | 5/1974 | Kimura | |
| 6,075,410 A | 6/2000 | Wildhagen | |
| 6,466,630 B1 | 10/2002 | Jensen | |
| 6,731,209 B2 | 5/2004 | Wadlow et al. | |
| 7,062,236 B2 | 6/2006 | Midtgaard et al. | |
| 7,123,665 B2 | 10/2006 | Brown et al. | |
| 7,123,666 B2 | 10/2006 | Brown et al. | |
| 7,127,020 B2 | 10/2006 | Brown | |
| 7,356,091 B2 | 4/2008 | Liu | |
| 7,672,648 B1 * | 3/2010 | Groe | H03C 1/06 330/127 |
| 7,860,466 B2 | 12/2010 | Woo et al. | |
| 7,869,543 B2 | 1/2011 | Reddy et al. | |
| 8,351,876 B2 | 1/2013 | McCallister et al. | |

(Continued)

OTHER PUBLICATIONS

International Search Report and Written Opinion for PCT/US2016/021833, dated Apr. 21, 2016, 1-11 (11 paged).

(Continued)

*Primary Examiner* — Emmanuel Bayard
(74) *Attorney, Agent, or Firm* — Invention Mine LLC

(57) ABSTRACT

An example method according to some embodiments includes receiving, from a modulator, a phase-modulated carrier output signal having a carrier center frequency that is a non-integer multiple of a desired carrier center frequency; generating, by an injection-locked ring oscillator (ILRO), a plurality of phases of the phase-modulated carrier output signal at a plurality of outputs of the ILRO; generating a decoupled fractional frequency output signal by sequentially selecting, using a multiplexer, successive outputs of the plurality of outputs corresponding to successive phases of the plurality of phases, the decoupled fractional frequency output signal having a center frequency equal to an integer multiple of the desired carrier center frequency; and generating, based on the decoupled fractional frequency output signal, a desired phase-modulated carrier output signal that is decoupled from the modulator, the desired phase-modulated carrier output signal having a generated carrier center frequency equal to the desired carrier center frequency.

20 Claims, 10 Drawing Sheets

(56) References Cited

U.S. PATENT DOCUMENTS

| | | | |
|---|---|---|---|
| 8,666,325 | B2 | 3/2014 | Shute et al. |
| 8,682,315 | B2 | 3/2014 | Mehta et al. |
| 8,803,627 | B1 | 8/2014 | Xu et al. |
| 8,994,423 | B2 | 3/2015 | Jenkins |
| 9,172,570 | B1* | 10/2015 | Li Puma .................. H03C 5/00 |
| 9,391,625 | B1 | 7/2016 | Xu et al. |
| 9,608,648 | B2 | 3/2017 | Xu et al. |
| 9,673,829 | B1 | 6/2017 | Xu et al. |
| 9,985,638 | B2 | 5/2018 | Xu et al. |
| 10,148,230 | B2 | 12/2018 | Xu et al. |
| 2003/0203724 | A1* | 10/2003 | Luo ....................... H03C 3/0958 455/147 |
| 2006/0197613 | A1* | 9/2006 | Bunch .................. H03C 3/0966 331/16 |
| 2007/0013447 | A1 | 1/2007 | Hirano et al. |
| 2007/0189417 | A1* | 8/2007 | Waheed .................. H03C 5/00 375/300 |
| 2007/0189431 | A1* | 8/2007 | Waheed ............... H03C 3/0991 375/376 |
| 2008/0153437 | A1 | 6/2008 | Jensen et al. |
| 2008/0211576 | A1 | 9/2008 | Moffatt et al. |
| 2008/0225984 | A1 | 9/2008 | Ahmed et al. |
| 2008/0253481 | A1 | 10/2008 | Rivkin et al. |
| 2008/0290954 | A1* | 11/2008 | Chambers ............ H03K 23/486 331/18 |
| 2009/0054000 | A1 | 2/2009 | Waheed et al. |
| 2009/0066423 | A1* | 3/2009 | Sareen .................. H03L 7/0996 331/19 |
| 2009/0213980 | A1 | 8/2009 | Ding et al. |
| 2010/0009641 | A1* | 1/2010 | Osman .................. H04B 1/036 455/102 |
| 2010/0260077 | A1* | 10/2010 | Nakatani ................ H04B 1/525 370/278 |
| 2010/0279617 | A1* | 11/2010 | Osman .................. H04B 1/525 455/63.1 |
| 2013/0063220 | A1* | 3/2013 | McCune, Jr. ............ H03C 3/02 332/103 |
| 2014/0070857 | A1* | 3/2014 | Huang .................... H03L 7/081 327/156 |
| 2015/0180594 | A1* | 6/2015 | Chakraborty ......... H03L 7/0802 455/87 |
| 2016/0028411 | A1* | 1/2016 | Kuo ....................... G04F 10/005 327/107 |
| 2016/0248431 | A1* | 8/2016 | Luo ........................... G06F 1/04 |
| 2016/0322980 | A1 | 11/2016 | Xu et al. |
| 2017/0085405 | A1 | 3/2017 | Xu et al. |
| 2018/0183447 | A1* | 6/2018 | Sim ......................... H03L 7/081 |
| 2018/0287569 | A1 | 10/2018 | Xu et al. |

OTHER PUBLICATIONS

Alavi, Morteza S, "A Wideband 2×13-bit All-Digital I/O RF-DAC", IEEE Transactions on Microwave Theory and Techniques, vol. 62, No. 4, Apr. 2014, 732-752 (21 pages).
Aparin Vladimir , et al., "A Transformer Combined Quadrature Switched Capacitor Power Amplifier in 65nm CMOS", Qualcomm and ECE Dept., University of Utah Salt Lake City, UT, USA, Oct. 24, 2016, 1-4 (4 pages).
Bhat, Ritesh , et al., "A >1W 22GHz Switched-Capacitor Digital Power Amplifier with Wideband Mixed-Domain Multi-Tap FIR Filtering of OOB Noise Floor", IEEE International Solid-State Circuits Conference, ISSCC 2017, Session 13.10, High-Performance Transmitters, 2017, 234-236 (3 pages).
Bhat, Ritesh , et al., "A Watt-Level 2A GHz RF I/Q Power DAC Transmitter with Integrated Mixed-Domain FIR Filtering of Quantization Noise in 65 nm CMOS", IEEE Radio Frequency Integrated Circuits Symposium, 2014, 413-416 (4 pages).
Boos, Zdravko , et al., "A fully digital multimode polar transmitter employing 17b RF DAC in 3G mode,", IEEE International Solid-State Circuits Conference, ISSCC 2011, Session 211, Cellular, Feb. 2011, 376-378 (3 pages).

Chowdhury, Debopriyo , et al., "A 2.4GHz Mixed-Signal Polar Power Amplifier with Low-Power Integrated Filtering in 65nm CMOS", IEEE Custom Integrated Circuits Conference, Sep. 2010, 1-4 (4 pages).
Chowdhury, Debopriyo , et al., "A Fully-Integrated Efficient CMOS Inverse Class-D Power Amplifier for Digital Polar Transmitter", IEEE Journal of Solid-State Circuits, vol. 47, No. 5, May 2012, 1113-1122 (10 pages).
Chowdhury, Debopriyo , et al., "An Efficient Mixed-Signal 2.4-GHz Polar Power Amplifier in 65-nm CMOS Technology", IEEE Journal of Solid-State Circuits, vol. 46, No. 8, Aug. 2011, 1796-1809 (14 pages).
Cousinard, David , et al., "A 0.23mm2 Digital Power Amplifier with Hybrid Time/Amplitude Control Achieving 22.5dBm at 28% PAE for 802.11g", IEEE International Solid-State Circuits Conference, ISSCC Session 13.7, High-Performance Transmitters, 2017, 228-230 (3 pages).
Craninckx, Jan , et al., "A 1.75-GHz/3-V Dual-Modulus Divide-By-128/129 Prescaler in 0.7-μM CMOS", ESSCIRC 95: Twenty-first European Solid-State Circuits Conference, Lille, France, Sep. 1995, 254-257 (4 pages).
Groe, John , "Polar Transmitters for Wireless Communications", IEEE Communications Magazine, Sep. 2007, 58-63 (6 pages.
Hung, Tsai-Pi , et al., "Design of H-Bridge Class-D Power Amplifiers for Digital Pulse Modulation Transmitters", IEEE Transactions on Microwave Theory and Techniques, vol. 55, No. 12, Dec. 2007, 2845-2855 (11 pages).
Jin, Hadong , et al., "Efficient Digital Quadrature Transmitter Based on IQ Cell Sharing", IEEE Journal of Solid-State circuits, vol. 52, No. 5, May 2017, 1345-1357 (13 pages).
Liao, Dongyi , et al., "An 802.11a/b/g/n Digital Fractional-N PLL With Automatic TDC Linearity Calibration for Spur Cancellation", IEEE Journal of Solid-State Circuits, 0018-9200, Jan. 16, 2017, 1-11 (11 pages).
McCune, E , et al., "A Fully Polar Transmitter for Efficient Software-Defined Radios", IEEE MTT-S International Microwave Symposium (IMS), Jun. 2017, 1-4(4 pages).
Mini-Circuits , "Application Note on Transformers", https://www.minicircuits.com/app/AN20-002.pdf; AN-20-002, Jun. 2, 2010, 1-15 (15 pages).
Pellerano, Stefano , et al., "A 4.75-GHz Fractional Frequency Divider-by-1.25 With TDC-Based All-Digital Spur Calibration in 45-nm CMOS", IEEE Journal of Solid-State Circuits, vol. 44, No. 12, Dec. 2009, 3422-3433 (12 pages).
Peng, Xing-Qiang , et al., "A 26.3 dBm 2.5 to 6 GHz Wideband Class-D Switched-Capacitor Power Amplifier with 40% Peak PAE", IEEE International Conference on Electron Devices and Solid-State Circuits, Jun. 2014, 18-20 (2 pages).
Presti, Calogero , et al., "A high resolution 24-dBm Digitally-Controlled CMOS PA for Multi-Standard RF Polar Transmitters,", ESSCIRC—34th European Solid-State Circuits Conference, IEEE Xplore Feb. 25, 2016, Sep. 2008, 482-485 (4 pages).
Presti, Calogero , et al., "Closed-Loop Digital Predistortion System With Fast Real-Time Adaptation Applied to a Handset WCDMA PA Module", IEEE Transactions on Microwave Theory and Techniques, vol. 60, No. 3, Mar. 2012, 604-618 (15 pages).
Serneels, Bert , et al., "A 5.5 V SOPA Line Driver in a Standard 1.2 V 0.13 μm CMOS Technology", Proceedings of ESSCIRC, Grenoble, France,, 2005, 303-306 (4 pages).
Staszewski, Robert B, et al., "Spur-Free Multirate All-Digital PLL for Mobile Phones in 65 nm CMOS", IEEE Journal of Solid-State Circuits, vol. 46, No. 12, Dec. 2011, 2904-2919 (16 pages).
Stitt, Mark , "Simple Filter Turns Square Waves into Sine Waves", Burr-Brown Application Bulletin; 1993 Burr-Brown Corporation, Printed in U.S.A., Dec. 1993, 1-3 (3 pages).
Vaucher, Cicero S, et al., "A Family of Low-Power Truly Modular Programmable Dividers in Standard 0.35-um CMOS Technology", IEEE Journal of Solid-State Circuits, vol. 35, No. 7, Jul. 2000, 1039-1045 (7 pages).
Walling, Jeffrey , et al., "WSB: Digital PAs: Switched Capacitor Circuits Pave the Way to Reconfigurability", University of California, Berkeley; RFIC2014, Tampa Bay, Jun. 2014, 1-32 (32 pages).

(56) References Cited

OTHER PUBLICATIONS

Winoto, Renaldi, et al., "A 2×2 WLAN and Bluetooth Combo SoC in 28nm CMOS with On-Chip WLAN Digital Power Amplifier, Integrated 2G/BT SP3T Switch and BT Pulling Cancelation", IEEE International Solid-State Circuits Conference, ISSCC 2016, Session 9.4, High-Performance Wireless, Feb. 2, 2016, 170-172 (3 pages).

Wong, Alden, et al., "A Dual Core Power Combining Digital Power Amplifier for 802.11b/g/n with +26.8dBm Linear Output Power in 28nm CMOS", IEEE Radio Frequency Integrated Circuits Symposium, Marvell Semiconductor, Santa Clara, Jun. 2017, 192-195 (4 pages).

Ye, Lu, et al., "Design Considerations for a Direct Digitally Modulated Wlan Transmitter With Integrated Phase Path and Dynamic Impedance Modulation", IEEE Journal of Solid-State Circuits, vol. 48, No. 12, Dec. 2013, 3160-3177 (18 pages).

Yoo, Sang-Min, et al., "A Class-G Switched-Capacitor RF Power Amplifier", IEEE Journal of Solid-State Circuits, vol. 48, No. 5, May 2013, 1212-1224 (13 pages).

Yoo, Sang-Min, et al., "A Switched-Capacitor RF Power Amplifier", IEEE Journal of Solid-State Circuits, vol. 46, No. 12, Dec. 2011, 2977-3987 (11 Pages).

Yu, W.-H., et al., "Low-complexity, full-resolution, mirror-switching digital predistortion scheme for polar-modulated power amplifiers", Electronic Letters, vol. 48, No. 24, Nov. 22, 2012, 1-2 (2 pages).

Yuan, Wen, et al., "A Multiphase Switched Capacitor Power Amplifier", IEEE Journal of Solid-State Circuits, vol. 52, No. 5, May 2017, 1320-1330 (11 pages).

Yuan, Wen, et al., "A Quadrature Switched Capacitor Power Amplifier", IEEE Journal of Solid-State Circuits, vol. 51, No. 5, May 2016, 1200-1209 (10 pages).

Zhu, Qiuyao, et al., "A Digital Polar Transmitter with DC-DC Converter Supporting 256-QAM WLAN and 40 MHz LTE-A Carrier Aggregation", IEEE Radio Frequency Integrated Circuits Symposium, 2016, 198-201 (4 pages).

Zhu, Qiuyao, et al., "A Digital Polar Transmitter With DC-DC Converter Supporting 256-QAM WLAN and 40-MHz LTE-A Carrier Aggregation", IEEE Journal of Solid-State Circuits, 2017, 1-14 (14 pages).

* cited by examiner

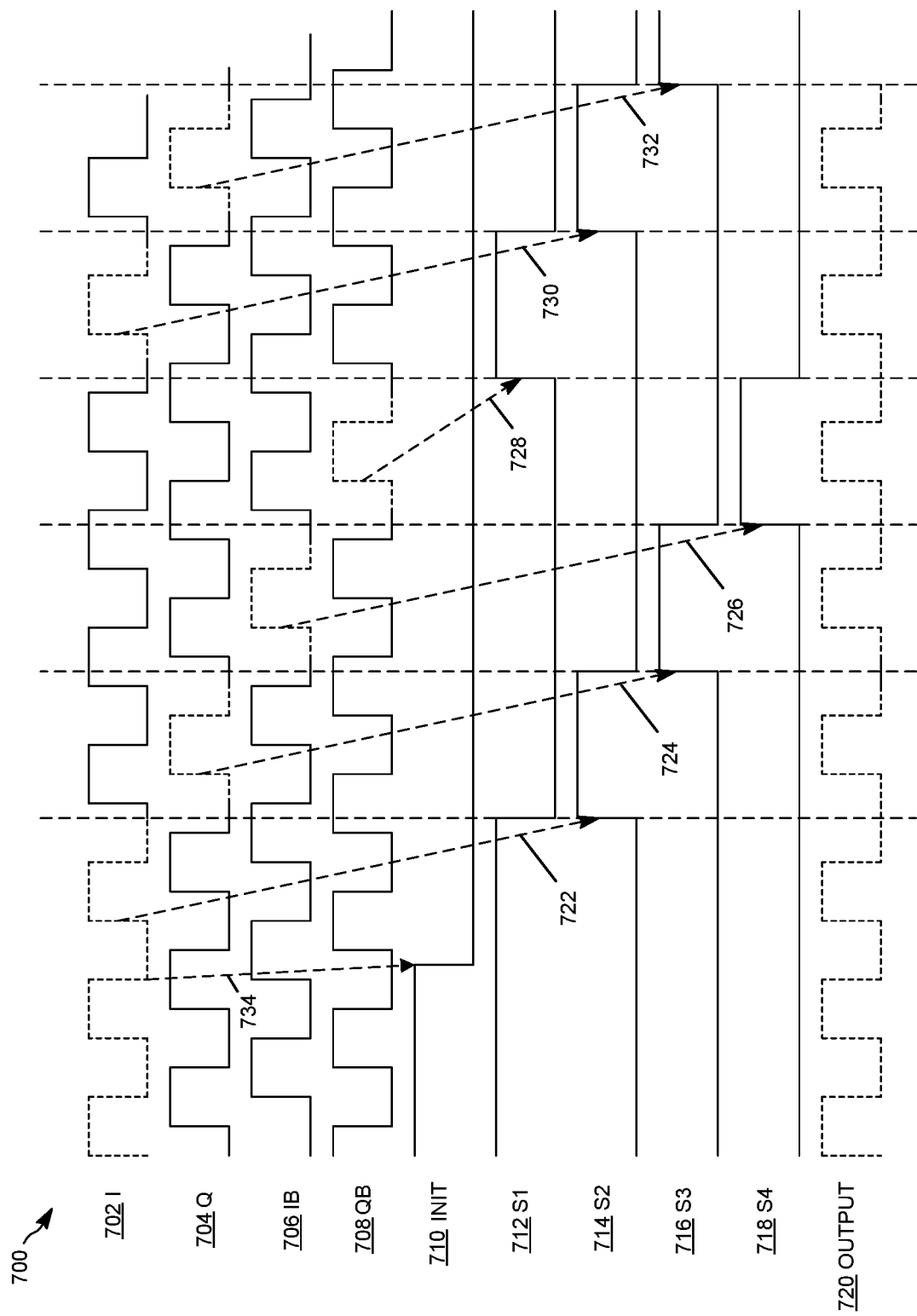

```
┌─────────────────────────────────────────────────────────┐
│  RECEIVING, FROM A MODULATOR, A PHASE-MODULATED CARRIER │
│  OUTPUT SIGNAL HAVING A CARRIER CENTER FREQUENCY THAT IS A │
│  NON-INTEGER MULTIPLE OF A DESIRED CARRIER CENTER       │
│  FREQUENCY                                              │
│  802                                                    │
└─────────────────────────────────────────────────────────┘
                            │
                            ▼
┌─────────────────────────────────────────────────────────┐
│  GENERATING, BY AN INJECTION-LOCKED RING OSCILLATOR (ILRO), A │
│  PLURALITY OF PHASES OF THE PHASE-MODULATED CARRIER     │
│  OUTPUT SIGNAL AT A PLURALITY OF OUTPUTS OF THE ILRO    │
│  804                                                    │
└─────────────────────────────────────────────────────────┘
                            │
                            ▼
┌─────────────────────────────────────────────────────────┐
│  GENERATING A DECOUPLED FRACTIONAL FREQUENCY OUTPUT     │
│  SIGNAL BY SEQUENTIALLY SELECTING, USING A MULTIPLEXER, │
│  SUCCESSIVE OUTPUTS OF THE PLURALITY OF OUTPUTS         │
│  CORRESPONDING TO SUCCESIVE PHASES OF THE PLURALITY OF  │
│  PHASES, THE DECOUPLED FRACTIONAL FREQUENCY OUTPUT SIGNAL │
│  HAVING A CENTER FREQUENCY EQUAL TO AN INTEGER MULTIPLE OF │
│  THE DESIRED CARRIER CENTER FREQUENCY                   │
│  806                                                    │
└─────────────────────────────────────────────────────────┘
                            │
                            ▼
┌─────────────────────────────────────────────────────────┐
│  GENERATING, BASED ON THE DECOUPLED FRACTIONAL FREQUENCY │
│  OUTPUT SIGNAL, A DESIRED PHASE-MODULATED CARRIER OUTPUT │
│  SIGNAL THAT IS DECOUPLED FROM THE MODULATOR, THE DESIRED │
│  PHASE-MODULATED CARRIER OUTPUT SIGNAL HAVING A GENERATED │
│  CARRIER CENTER FREQUENCY EQUAL TO THE DESIRED CARRIER  │
│  CENTER FREQUENCY                                       │
│  808                                                    │
└─────────────────────────────────────────────────────────┘
```

SYSTEM AND METHOD FOR DIVIDING THE CARRIER CENTER FREQUENCY OF AN RF MODULATED SIGNAL BY A NON-INTEGER DIVISOR

BACKGROUND

Inductors and inductive components suffer from mutual coupling and therefore frequency of oscillators can be disturbed by other nearby electromagnetic fields. This effect is called frequency pulling. As a result, frequency pulling in transmitters (and receivers) may cause such devices to transmit (or receive) signals with altered carrier frequencies. An oscillator or oscillator circuit may generate a sinusoidal signal with a particular resonance frequency and harmonics (or multiples) of that particular resonance frequency. If an oscillator generates a sinusoidal signal with a resonance frequency $\omega_0$, harmonic frequencies may include the frequencies $2*\omega_0$, $3*\omega_0$, $4*\omega_0$, and other multiples of $\omega_0$.

SUMMARY

An example method disclosed herein in accordance with some embodiments may include: receiving, from a modulator, a phase-modulated carrier output signal having a carrier center frequency that is a non-integer multiple of a desired carrier center frequency; generating, by an injection-locked ring oscillator (ILRO), a plurality of phases of the phase-modulated carrier output signal at a plurality of outputs of the ILRO; generating a decoupled fractional frequency output signal by sequentially selecting, using a multiplexer, successive outputs of the plurality of outputs corresponding to successive phases of the plurality of phases, the decoupled fractional frequency output signal having a center frequency equal to an integer multiple of the desired carrier center frequency; and generating, based on the decoupled fractional frequency output signal, a desired phase-modulated carrier output signal that is decoupled from the modulator, the desired phase-modulated carrier output signal having a generated carrier center frequency equal to the desired carrier center frequency.

According to the example method, in some embodiments, an oscillation frequency of the ILRO may be tuned to be substantially-near the carrier center frequency of the phase-modulated carrier output signal.

According to the example method, in some embodiments, generating the plurality of phases may further include tuning an oscillation frequency of the ILRO to be substantially near the carrier center frequency.

According to the example method, in some embodiments, generating the plurality of phases may further include injecting, by an injection circuit coupled to the ILRO, the phase-modulate carrier output signal into the ILRO.

The example method may further include, in some embodiments, transmitting the desired phase-modulated carrier output signal having the generated carrier center frequency equal to the desired carrier center frequency.

According to the example method, in some embodiments, the carrier center frequency of the phase-modulated carrier output signal may be 1.25 times the center frequency of the decoupled fractional frequency output signal.

According to the example method, in some embodiments, receiving the phase-modulated carrier output signal may include receiving phase-modulated carrier signals with phases of 0 degrees and 180 degrees.

According to the example method, in some embodiments, generating, by the ILRO, the plurality of phases of the phase-modulated carrier output signal generates phases of 0, 90, 180, and 270 degrees.

The example method may further include, in some embodiments, aligning the plurality of phases of the phase-modulated carrier output signal into a plurality of pairs of phases.

According to the example method, in some embodiments, generating the desired phase-modulated carrier output signal based on the decoupled fractional frequency output signal may include: dividing by 2 the center frequency of the decoupled fractional frequency output signal.

Further according to the example method, in some embodiments, dividing by 2 the center frequency of the decoupled fractional frequency output signal may include: triggering a divide-by-2 output signal to go high upon a rising edge of the decoupled fractional frequency output signal; and resetting the divide-by-2 output signal to low after an adjustable period of time, wherein a center frequency of the divide-by-2 output signal may be half the center frequency of the decoupled fractional frequency output signal.

According to the example method, in some embodiments, sequentially selecting successive outputs of the plurality of outputs corresponding to successive phases of the plurality of phases may include repeating a sequential process that may include: responsive to detecting a rising edge of a current phase of the plurality of phases, selecting a portion of a next phase of the plurality of phases; setting a next portion of the decoupled fractional frequency output signal equal to the selected portion of the next phase; and setting the current phase equal to the next phase.

Further according to the example method, in some embodiments, the sequential process may further include delaying the current phase prior to detecting the rising edge of the current phase.

An example apparatus disclosed herein in accordance with some embodiments may include: a digitally-controlled oscillator (DCO) circuit configured to output a phase-modulated carrier output signal having a carrier center frequency that is a non-integer multiple of a desired carrier center frequency; an injection-locked ring oscillator (ILRO) configured to generate a plurality of phases of the phase-modulated carrier output signal at a plurality of outputs of the ILRO; and a fractional frequency division circuit coupled to the plurality of outputs of the ILRO, the fractional frequency division circuit configured to sequentially-select, using a multiplexer (MUX), successive outputs of the plurality of outputs corresponding to successive phases of the plurality of phases to generate a decoupled fractional frequency output signal having a center frequency equal to an integer multiple of the desired carrier center frequency.

According to the example apparatus, in some embodiments, the ILRO may be configured such that an oscillation frequency of the ILRO is tuned to be substantially-near the carrier center frequency of the phase-modulated carrier output signal.

The example apparatus may further include, in some embodiments, an injection circuit coupled to the ILRO and to an output of the DCO circuit and configured to inject the phase-modulate carrier output signal into the ILRO.

The example apparatus may further include, in some embodiments, an integer frequency division circuit coupled to the fractional frequency division circuit and configured to generate, based on the decoupled fractional frequency output signal, a desired phase-modulated carrier output signal that is decoupled from the DCO circuit, the desired phase-modulated carrier output signal having a generated carrier center frequency equal to the desired carrier center frequency.

Further according to the example apparatus, in some embodiments, the integer frequency division circuit may be further configured to generate the desired phase-modulated carrier output signal based on the decoupled fractional frequency output signal by dividing by 2 the center frequency of the decoupled fractional frequency output signal. In some embodiments, the integer frequency division circuit may be further configured to trigger an integer frequency division output signal to go high upon a rising edge of the decoupled fractional frequency output signal. In some embodiments, the integer frequency division circuit may be further configured to reset the integer frequency division output signal to low after an adjustable period of time. In some embodiments, a center frequency of the integer frequency division output signal may be equal to half the center frequency of the fractional frequency output signal.

Further according to the example apparatus, the example apparatus may further include, in some embodiments, an amplifier configured to amplify the desired phase-modulated carrier output signal for transmission.

According to the example apparatus, in some embodiments, the fractional frequency division circuit may include the MUX and multiple delay flip-flops, the multiple delay flip-flops having respective outputs configured to sequentially select the successive outputs of the plurality of outputs corresponding to successive phases of the plurality of phases.

According to the example apparatus, in some embodiments, the carrier center frequency of the phase-modulated carrier output signal may be 1.25 times the center frequency of the decoupled fractional frequency output signal.

According to the example apparatus, in some embodiments, the DCO circuit may be configured to output the phase-modulated carrier output signal with phases of 0 degrees and 180 degrees.

According to the example apparatus, in some embodiments, the ILRO may be further configured to generate the phases of 0, 90, 180, and 270 degrees of the phase-modulated carrier output signal.

According to the example apparatus, in some embodiments, the fractional frequency division circuit may be further configured to align the plurality of phases of the phase-modulated carrier output signal into a plurality of pairs of phases.

According to the example apparatus, in some embodiments, the fractional frequency division circuit may be configured to repeat a sequential process including: responsive to detecting a rising edge of a current phase of the plurality of phases, selecting a portion of a next phase of the plurality of phases; setting a next portion of the decoupled fractional frequency output signal equal to the selected portion of the next phase; and setting the current phase equal to the next phase.

Further according to the example apparatus, the example apparatus may further include, in some embodiments, a delay element coupled to the fractional frequency division circuit and configured to delay the current phase prior to detecting the rising edge of the current phase.

Another example apparatus disclosed herein in accordance with some embodiments may include: a processor; and a non-transitory computer-readable medium storing instructions that are operative, when executed by the processor, to perform the functions including: receiving, from a modulator, a phase-modulated carrier output signal having a carrier center frequency that is a non-integer multiple of a desired carrier center frequency; generating, by an injection-locked ring oscillator (ILRO) a plurality of phases of the phase-modulated carrier output signal at a plurality of outputs of the ILRO; generating a decoupled fractional frequency output signal by sequentially selecting, using a multiplexer, successive outputs of the plurality of outputs corresponding to successive phases of the plurality of phases, the decoupled fractional frequency output signal having a center frequency equal to an integer multiple of the desired carrier center frequency; and generating, based on the decoupled fractional frequency output signal, a desired phase modulated carrier output signal that is decoupled from the modulator, the desired phase-modulated carrier output signal having a generated carrier center frequency equal to the desired carrier center frequency.

BRIEF DESCRIPTION OF THE DRAWINGS

FIG. 7 is a timing diagram showing example relative timing relationships for phase signals and a fractional frequency output signal according to some embodiments.

FIG. 8 is a flowchart illustrating an example process for generating a fractional frequency output signal according to some embodiments.

The entities, connections, arrangements, and the like that are depicted in—and described in connection with—the various figures are presented by way of example and not by way of limitation. As such, any and all statements or other indications as to what a particular figure "depicts," what a particular element or entity in a particular figure "is" or "has," and any and all similar statements—that may in isolation and out of context be read as absolute and therefore limiting—may only properly be read as being constructively preceded by a clause such as "In at least one embodiment, . . . " For brevity and clarity of presentation, this implied leading clause is not repeated ad nauseum in the detailed description of the drawings.

DETAILED DESCRIPTION

In accordance with some embodiments, to reduce frequency pulling, a fractional divider circuit may be used. Systems and methods described herein in accordance with some embodiments may use a fractional divider to reduce coupling between two or more inductive and/or capacitive elements for some embodiments. For example, an amplifier, such as a digital power amplifier, may have inductive elements that become coupled to inductive elements of a modulator circuit, such as a digitally-controlled oscillator circuit described herein.

Figure 1:
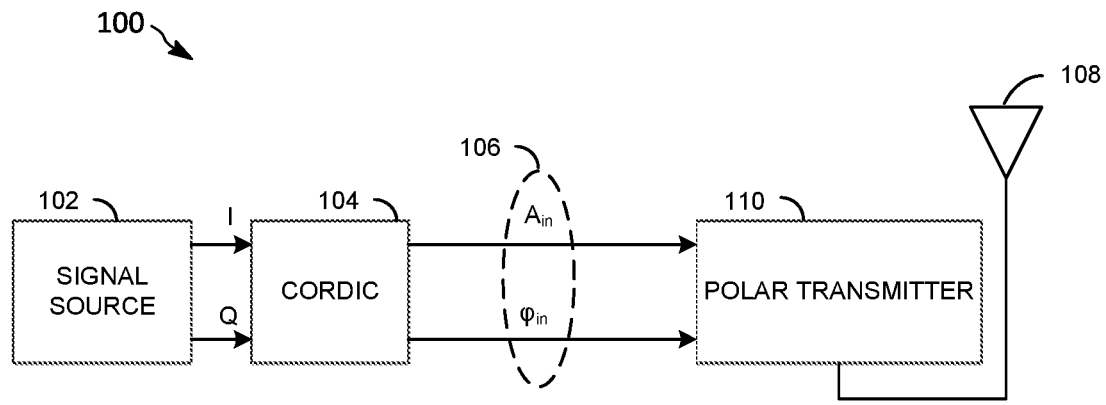
FIG. 1 is a block diagram of an example polar coordinate conversion and polar transmission system in accordance with some embodiments.

FIG. 1 is a block diagram of an example polar coordinate conversion and polar transmission system 100 in accordance with some embodiments. A signal source 102 is provided to generate in-phase (I) and quadrature (Q) values of a signal to be transmitted. Signal source 102 may be any source of I and Q values known to those of skill in the art, such as encoders for frequency modulated or phase-modulated radio-frequency signals, such as signals modulated using phase shift keying (PSK) or quadrature amplitude modulation (QAM). As the term is used in the present disclosure, phase-modulated signals include signals that are modulated in phase (e.g., binary phase-shift keying (BPSK), quadrature phase-shift keying (QPSK), 8-PSK, or 16-PSK) as well as signals that are modulated in both phase and amplitude (e.g., 16-QAM, 64-QAM, or 256-QAM, or multicarrier combinations of such signals, as in Orthogonal Frequency Division Multiplexed (OFDM) signals). Frequency modulated signals include, among others, frequency shift keying (FSK) signals such as binary frequency-shift keying (BFSK) signals, multiple frequency-shift keying (MFSK) signals, and minimum-shift keying (MSK) signals.

The in-phase and quadrature signals from signal source 102 are provided to a coordinate rotation digital computer (CORDIC) logic circuit 104. The CORDIC logic circuit 104 converts the Cartesian I and Q signals to a corresponding polar signal that includes digital amplitude and phase signals. The amplitude signal $A_{in}$ and the phase signal $\varphi_{in}$ are provided through a polar signal input 106 to a polar transmitter 110. The polar transmitter 110 generates a phase-and-amplitude modulated radio-frequency (RF) output signal corresponding to the polar signal and transmits the signal at an antenna 108. In some embodiments, the radio-frequency signal, also referred to herein as a modulated carrier signal, has a frequency in the range of 2412 MHz-2484 MHz, although the use of the polar transmitter 110 is not limited to that frequency range. In general, a polar transmitter and/or transceiver in accordance with some of the embodiments disclosed herein may be used at any suitable frequency. Some particular frequency bands and ranges include those for LTE (4G) (e.g., 700 MHz-6 GHz), 5G (e.g., 600 MHz-6 GHz, 24-86 GHz), and any applicable frequency bands for standards such as LTE, GSM, WiMax and WiFi 802.11 standards (e.g., 2.4 GHz, 5 GHz, 900 MHz), although it will be understood that any frequency may be used in accordance with a particular implementation.

The polar transmitter 110 includes power amplifier circuitry (not shown) in FIG. 1 in accordance with some embodiments described herein.

Some examples and implementations of, e.g., polar transmitter architecture and digital power amplifiers such as may be used, e.g., in the example polar coordinate conversion and polar transmission system 100 of FIG. 1 in accordance with some embodiments are described in greater detail in the following: U.S. patent application Ser. No. 16/241,842, filed Jan. 7, 2019, entitled "SYSTEMS AND METHODS FOR MAXIMIZING POWER EFFICIENCY OF A DIGITAL POWER AMPLIFIER IN A POLAR TRANSMITTER"; U.S. Pat. No. 9,391,625, issued on Jul. 12, 2016, entitled "WIDEBAND DIRECT MODULATION WITH TWO-POINT INJECTION IN DIGITAL PHASE LOCKED LOOPS"; U.S. Pat. No. 9,608,648, issued on Mar. 28, 2017, entitled "WIDEBAND DIRECT MODULATION WITH TWO-POINT INJECTION IN DIGITAL PHASE LOCKED LOOPS"; U.S. Pat. No. 9,985,638, issued on May 29, 2018, entitled "WIDEBAND DIRECT MODULATION WITH TWO-POINT INJECTION IN DIGITAL PHASE LOCKED LOOPS"; U.S. Pat. No. 10,148,230, issued Dec. 4, 2018, entitled "ADAPTIVE DIGITAL PREDISTORTION FOR POLAR TRANSMITTER," the entirety of each of which is incorporated herein by reference. In still further embodiments, the polar transmitter may include a linearization circuit, examples of which are described in U.S. patent application Ser. No. 16/125,510, filed Sep. 7, 2018, entitled "FREQUENCY CONTROL WORD LINEARIZATION FOR AN OSCILLATOR," the entirety of which is incorporated herein by reference.

In some embodiments, the CORDIC logic circuit 104 may include a signal phase generator and a signal envelope generator (not shown in FIG. 1). According to some embodiments, the baseband in-phase (I) signals and quadrature (Q) signals are received at the CORDIC logic circuit 104 from the signal source 102, with the signal phase generator configured to process the I and Q signals and perform a rectangular-to-polar conversion to generate the phase signal $\varphi_{in}$. In some embodiments, the signal phase generator is a CORDIC calculator. According to some embodiments, the signal envelope generator is configured to process the I and Q signals received at the CORDIC logic circuit 104 and perform a rectangular-to-polar conversion to generate an envelope signal, for example the amplitude signal $A_{in}$ of FIG. 1. The envelope signal may correspond to the envelope of a desired information-modulated transmit signal, such as the envelope formed by the magnitude of the I and Q signals received at the CORDIC logic circuit. The envelope signal may, e.g., be digital in nature and be used to control a digitally switching amplifier within the polar transmitter 110.

Figure 2:
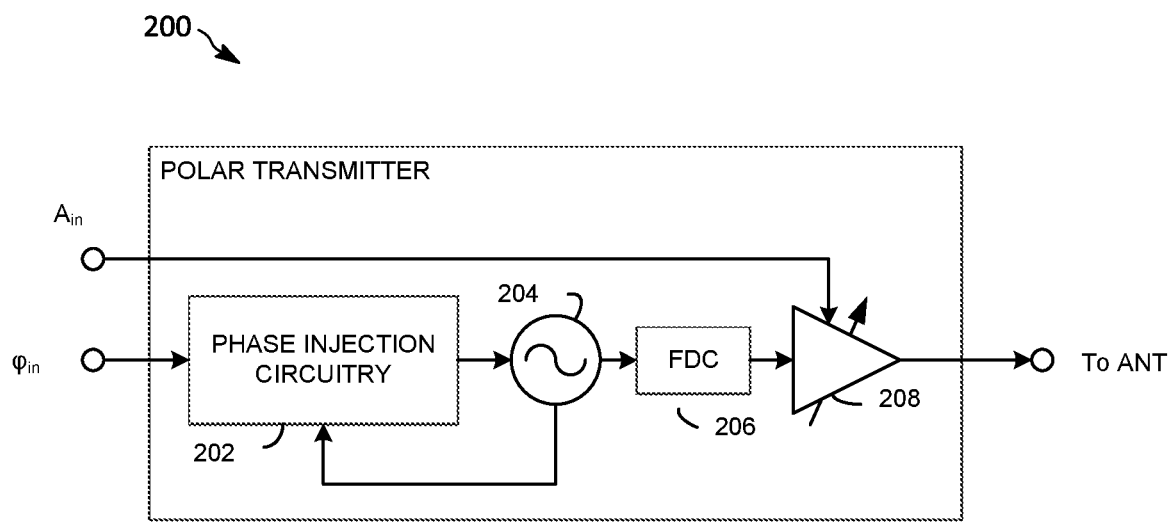
FIG. 2 is a block diagram of an example polar transmitter in accordance with some embodiments.

FIG. 2 is a block diagram of an example polar transmitter 200 in accordance with some embodiments. The polar transmitter 200 is an example implementation of the polar transmitter 110 of FIG. 1.

In the example of FIG. 2, the polar transmitter 200 receives the amplitude signal $A_{in}$ and the phase signal $\varphi_{in}$ output by the CORDIC logic circuit 104 of FIG. 1. According to the example, the phase signal $\varphi_{in}$ is injected using phase injection circuitry 202 into a phase-locked loop that includes a digitally-controlled oscillator (DCO) 204. The phase injection circuitry 202 compares the phase of the DCO output with the phase identified by the phase signal $\varphi_{in}$ and controls the DCO such that the phase of the DCO output more closely matches the phase of phase signal $\varphi_{in}$. The oscillating signal that is generated by the DCO 204 and that is the DCO output is, e.g., after processing by FDC 206, then amplified by power amplifier circuitry 208, with the gain of the power amplifier circuitry 208 being controlled by the digital amplitude signal $A_{in}$. The radio-frequency output of the power amplifier circuitry 208 is provided to an antenna (e.g., antenna 108) for transmission.

In some embodiments, the polar transmitter 110 of FIG. 1 may be further simplified. In another example of a polar transmitter, the incoming phase signal $\varphi_{in}$ may be processed at a differentiator with the output of the differentiator then applied to a DCO, e.g., the DCO 204. The output of the DCO may be applied to a loop filter and then fed back and combined at the input the DCO with the output of the differentiator. The resulting DCO output may be applied to an amplifier (e.g., the power amplifier circuitry 208 of FIG. 2) to generate an amplified transmit signal (e.g., controlled by the amplitude signal $A_{in}$).

In some embodiments, a frequency division circuit (FDC) 206 (including, e.g., phase generation and frequency division circuitry) may be placed between the DCO 204 and the power amplifier circuitry 208, as shown in FIG. 2. The digital oscillator (e.g., DCO 204) may operate at a higher frequency than the frequency ultimately transmitted at the antenna and may, e.g., undergo a frequency division to, e.g., reduce oscillator pulling caused by the amplifier (e.g., power amplifier circuitry 208).

In accordance with some embodiments, to reduce frequency pulling, a fractional divider circuit may be used. Systems and methods described herein in accordance with some embodiments may use a fractional divider to reduce coupling between two or more inductive and/or capacitive elements for some embodiments. For example, an amplifier, such as a digital power amplifier, may have inductive elements that become coupled to inductive elements of a modulator circuit, such as a digitally-controlled oscillator circuit described herein.

Figure 3:
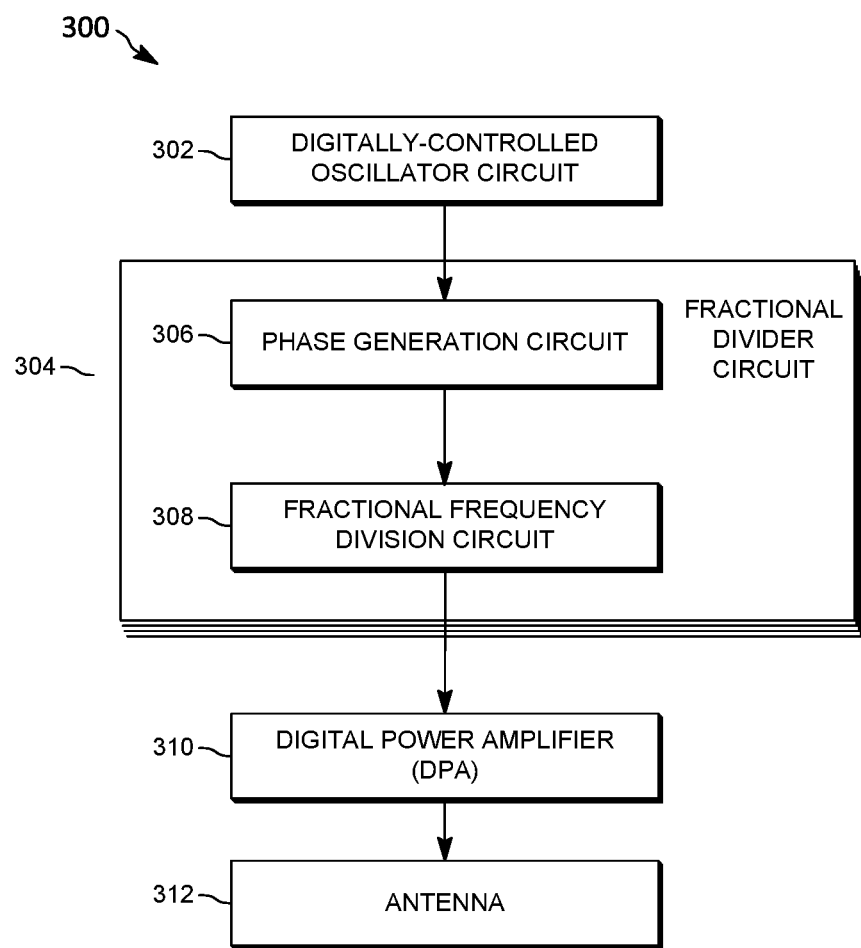
FIG. 3 is a system diagram illustrating an arrangement of components for generating a fractional frequency output signal according to some embodiments.

FIG. 3 is a system diagram 300 illustrating an example arrangement of components for generating a fractional frequency output signal according to some embodiments. For some embodiments, a digitally-controlled oscillator (DCO) circuit 302 (such as DCO 204 of FIG. 2) may include inputs to receive data to be transmitted and to receive a control signal to control the oscillation frequency of the DCO circuit. The DCO circuit 302 may include a DCO to generate a phase-modulated carrier output signal having a carrier center frequency.

A fractional divider circuit (FDC) 304 (such as FDC 206 of FIG. 2) may include a phase generation circuit 306 (such as, e.g., a phase offset circuit) and a fractional frequency division circuit 308. An input of the phase generation circuit 306 of the FDC 304 may be coupled to an output of the DCO circuit 302. The output of the DCO circuit 302 may be used to inject a phase-modulated carrier output signal into the phase generation circuit 306. The phase generation circuit 306 may be configured to generate a set of phase-modulated carrier output signals with different phases. The term phase signals may refer to two or more signals respectively corresponding to two or more phases of a phase-modulated carrier output signal. For example, the phase-modulated carrier output signal may have a phase of 0 degrees, and the phase generation circuit may generate a set of phase signals with phases of 0 degrees, 90 degrees, 180 degrees, and 270 degrees. For some embodiments, the DCO circuit 302 may generate phase-modulated carrier output signals with phases of 0 degrees and 180 degrees, and the phase generation circuit 306 may generate a set of signals with phases of 0 degrees, 90 degrees, 180 degrees, and 270 degrees. With some embodiments, the phase generation circuit may generate signals with phases of 0 degrees, 45 degrees, 90 degrees, 135 degrees, 180 degrees, 225 degrees, 270 degrees, and 315 degrees. In some embodiments, the phase generation circuit 306 may generate other sets of phase signals by using different divider ratios. For some embodiments, the phase generation circuit 306 may include circuits allocated for particular frequency ranges of the phase-modulated carrier output signal. For example, the phase generation circuit 306 may be configured to generate a set of phase signals with a first sub-circuit for a phase-modulated carrier output signal with a carrier center frequency range of 800 MHz to 2.5 GHz and with a second sub-circuit for a phase-modulated carrier output signal with a carrier center frequency range of 2.5 GHz to 6.25 GHz. Some embodiments of the phase generation circuit 306 may use multiple sub-circuits with other frequency ranges.

An input of the fractional frequency division circuit 308 may be coupled to an output (e.g., one or more outputs) of the phase generation circuit 306. As will be described in more detail, in some embodiments, the fractional frequency division circuit 308 may be configured to select portions of the set of phase signals. In some embodiments, successively selecting later and later phases of a signal, the period of the signal may be extended. Due to the inverse relationship between the period and the frequency of the signal, the frequency decreases with increases in the period, and vice versa, and frequency division is performed. The fractional frequency division circuit 308 may generate a fractional frequency output signal with a center frequency equal to the phase-modulated carrier output signal's carrier center frequency divided by a non-integer divisor. In some embodiments, the fractional frequency division circuit 308 may generate an output signal with a duty cycle modified to correspond to an adjustment of the modulator carrier frequency. For example, the fractional frequency division circuit 308 may receive a set of phase signals with phases of 0, 90, 180, and 270 degrees, respectively. According to the example, each signal in the set of phase signals may have a duty cycle of 50% (such as a square wave with approximately 50% of the time with a voltage above 3.3V and approximately 50% of the time with a voltage below 0.8V). With some embodiments, the fractional frequency division circuit 308 may select portions of the phase signal inputs to generate an output signal with an adjusted duty cycle. For example, if the non-integer divisor is equal to 1.25, the output of the fractional frequency division circuit 308 may have a duty cycle of 40%. Of course, other duty cycles may be used. The output of the fractional frequency division circuit 308 may be generated by sequentially selecting portions of 4 quadrature phases (such as phase signals with phases of 0, 90, 180, and 270 degrees, respectively).

An input of a power amplifier (such as power amplifier circuitry 208 of FIG. 2), shown as digital power amplifier (DPA) 310 in FIG. 3 may be coupled to an output of the fractional frequency division circuit 308 of the FDC 304. For some embodiments, the DPA 310 may be configured to amplify a fractional frequency output signal. A radio frequency (RF) antenna 312 may be coupled to an output of the DPA 310 and configured to transmit the amplified fractional frequency output signal. For some embodiments, the RF antenna 312 also may be configured to transmit a desired phase-modulated carrier output signal having a generated carrier center frequency equal to the desired carrier center frequency. Use of a fractional frequency division circuit helps to solve a pulling problem that may arise in some implementations due to, e.g., inductive elements of the DPA 310 coupling with inductive elements of the DCO circuit 302. The fractional frequency division circuit 308 may enable a modulator's phase-modulated carrier output signal to have a carrier frequency that is a non-integer multiple of a desired carrier center frequency, thus mitigating pulling effects. For example, in some embodiments, the desired phase-modulated carrier output signal may be configured to have a desired carrier center frequency that is decoupled from the modulator and the modulator's phase-modulated carrier output signal. This decoupling of carrier frequency (in the sense of the carrier frequencies not being non-harmonic, non-integer multiples of one another) between, e.g., the signal output by the DCO circuit 302 and, e.g., the signal output by the fractional frequency division circuit 308 limits electromagnetic interference between these signals, as well as between the DCO output signal and signals downstream from the fractional frequency division circuit 308, e.g., in this case the desired phase-modulated carrier output signal.

In some embodiments, an integer frequency division circuit such as a divide-by-N circuit (where N is a positive integer greater than 1) may be included before the DPA 310. In some embodiments, the fractional frequency division circuit 308 may include, e.g., a divide-by-N circuit such as a divide-by-2 (where N=2) circuit. In some embodiments, an integer frequency division circuit (a divide-by-N circuit, such as, e.g., a divide-by-2 circuit, where N=2) may be coupled between (not shown in FIG. 3) the fractional frequency division circuit 308 and the DPA 310. Similarly, the fractional divider circuit (FDC) 304 may include an integer frequency division circuit (a divide-by-N circuit), either as part of the fractional frequency division circuit 308 or coupled to the fractional frequency division circuit 308. In some embodiments, an integer frequency division circuit may be coupled between the FDC 304 and the DPA 310, such that, e.g., the integer frequency division circuit is not part of the FDC 304.

The present disclosure provides an example apparatus in accordance with some embodiments that includes: a processor; and a non-transitory computer-readable medium storing instructions that are operative, when executed by the processor, to perform functions including: receiving, from a modulator, a phase-modulated carrier output signal having a carrier center frequency that is a non-integer multiple of a desired carrier center frequency; generating, by an injection-locked ring oscillator (ILRO), a plurality of phases of the phase-modulated carrier output signal at a plurality of outputs of the ILRO; generating a decoupled fractional frequency output signal by sequentially selecting, using a multiplexer, successive outputs of the plurality of outputs corresponding to successive phases of the plurality of phases, the decoupled fractional frequency output signal having a center frequency equal to an integer multiple of the desired carrier center frequency; and generating, based on the decoupled fractional frequency output signal, a desired phase modulated carrier signal that is decoupled from the modulator, the desired phase-modulated carrier output signal having a generated carrier center frequency equal to the desired carrier center frequency.

Figure 4:
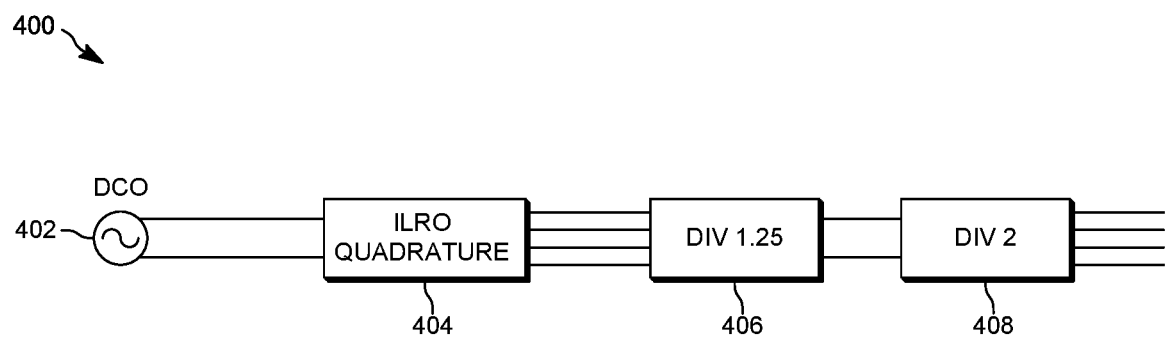
FIG. 4 is a schematic illustration showing an example configuration for modifying a carrier center frequency outputted by a digitally-controlled oscillator (DCO) according to some embodiments.

FIG. 4 is a schematic illustration showing an example configuration for modifying a carrier center frequency outputted by a digitally-controlled oscillator (DCO) 402 according to some embodiments. For some embodiments, the digitally-controlled oscillator (DCO) 402 may be used to generate a phase-modulated carrier output signal having a modulator carrier center frequency. The circuit 400 shown in FIG. 4 may be used to generate a fractional frequency output signal with a center frequency that is a non-harmonic (e.g., a non-integer multiple) frequency of the modulator carrier center frequency. In some embodiments, a DCO circuit (such as DCO circuit 302 of FIG. 3) may include inputs for receiving data to be transmitted and for receiving a control signal for controlling the DCO 402. The control signal may be generated by a processor, a processor-based circuit, or a component-based circuit for some embodiments. The DCO 402 (which may be part of a DCO circuit) may generate, e.g., two or more phase signals of the phase-modulated carrier output signal. For example, the DCO circuit may be configured to generate a pair of digitally-controlled oscillator signals having respective phases of 0 degrees and 180 degrees. The output of the DCO 402 may be connected to the inputs of an injection-locked ring oscillator (ILRO) 404 such that the phase signals of the phase-modulated carrier output signal are received by the ILRO 404.

For some embodiments, the DCO 402 may generate phase-modulated carrier output signals with phases of 0 degrees and 180 degrees, respectively, and a 50% duty cycle. In other embodiments, the DCO 402 may be used to generate phase-modulated carrier output signals with phases of 0 degrees and 180 degrees, respectively, and a 25% duty cycle.

For some embodiments, the ILRO 404 may be a sub-circuit of the phase generation circuit 306 shown in FIG. 3. The ILRO 404 may be configured to tune (or lock) the oscillation frequency of the ILRO to be substantially-near the carrier center frequency of the DCO 402 (or the phase-modulated carrier output signal). For some embodiments, the ILRO 404 be used to generate quadrature phase signals. For example, the ILRO 404 may output signals with phases of 0, 90, 180, and 270 degrees.

In some embodiments, the ILRO 404 and/or the divider stages 406, 408 may be selectively disabled and, e.g., the output signals from the DCO may be provided directly to an output, e.g., to a DPA such as DPA 310 of FIG. 3.

In some embodiments, each set of phase signals that are outputted by the ILRO 404 may be received by a non-integer fractional divider such as divide-by-1.25 circuit 406. Some embodiments of the divide-by-1.25 circuit 406 may be used to divide a carrier frequency of an input signal by a non-integer divisor equal to 1.25. For some embodiments, the divide-by-1.25 circuit 406 may output two phases of a fractional frequency output signal. The carrier frequency of the two phase signal outputs (or fractional frequency output signal(s)) may be divided by 2 by a divide-by-2 circuit 408 to generate 4 phase outputs. Some embodiments of the fractional frequency division circuit 308 of FIG. 3 may include the divide-by-2 circuit 408 of FIG. 4. For some embodiments, the divide-by-2 circuit 408 may be coupled between the divide-by-1.25 circuit 406 and an input to a digital power amplifier (DPA) (shown, for example, as DPA 310 in FIG. 3). For some embodiments, the phase generation circuit 306 of FIG. 3 may correspond to the ILRO 404 of FIG. 4. In some embodiments, the fractional frequency division circuit 308 of FIG. 3 may correspond to not only the divide-by-1.25 circuit 406 but also the divide-by-2 circuit 408 of FIG. 4. In some embodiments, the fractional frequency division circuit 308 of FIG. 3 may not include an integer frequency division circuit such as the divide-by-2 circuit 408 of FIG. 4. For some embodiments, the divide-by-1.25 circuit 406 may include a multiplexer to sequentially select successive phases of a phase-modulated carrier signal.

In operation, with some embodiments, the DCO may operate at $2.5*f_0$, (e.g., $1.25*2=2.5$) where $f_0$ is the carrier frequency of an RF transmitted signal. In some embodiments, if $f_0$ is between 1.6 GHz and 2.0 GHz, the DCO may operate at $2.5*f_0$, which correlates to a DCO frequency range of 4 GHz to 5 GHz.

Using one frequency range as a non-limiting illustrative example, in some embodiments, to transmit an RF signal in the mid-band (MB) and industrial, scientific, and medical (ISM) frequency ranges (1.7 GHz-2.5 GHz), the frequency of the DCO 402 may be set to a frequency between 4.25 GHz and 6.25 GHz, e.g., **$2.5*f_0$**, (e.g., $1.25*2=2.5$). For example, at the lower end of the MB and ISM frequency range (1.7 GHz), if the DCO 402 is set to 4.25 GHz, the ILRO 404 may generate an input to the divide-by-1.25 circuit 406 with a carrier frequency of 4.25 GHz. The divide-by-1.25 circuit 406 may generate an input to the divide-by-2 circuit 408 with a carrier frequency of 3.4 GHz. The divide-by-2 circuit 408 may generate an output signal with a carrier frequency of 1.7 GHz.

Likewise, for the upper end of the MB and ISM frequency range (2.5 GHz), if the frequency of the DCO 402 is set to 6.25 GHz, the ILRO 404 may generate an input to the divide-by-1.25 circuit 406 with a carrier frequency of 6.25 GHz. The divide-by-1.25 circuit 406 may generate an input to the divide-by-2 circuit 408 with a carrier frequency of 5.0 GHz. The divide-by-2 circuit 408 may generate an output signal with a carrier frequency of 2.5 GHz. These are merely example frequencies and frequency ranges and other frequencies and ranges may be used.

It will be understood that the particular divider circuit block and divisor used are merely examples, and that other values (e.g., non-integer divisor(s) other than or in addition to 1.25, integer divisor(s) other than or in addition to 2) may be used in other implementations in accordance with some embodiments.

Figure 5:
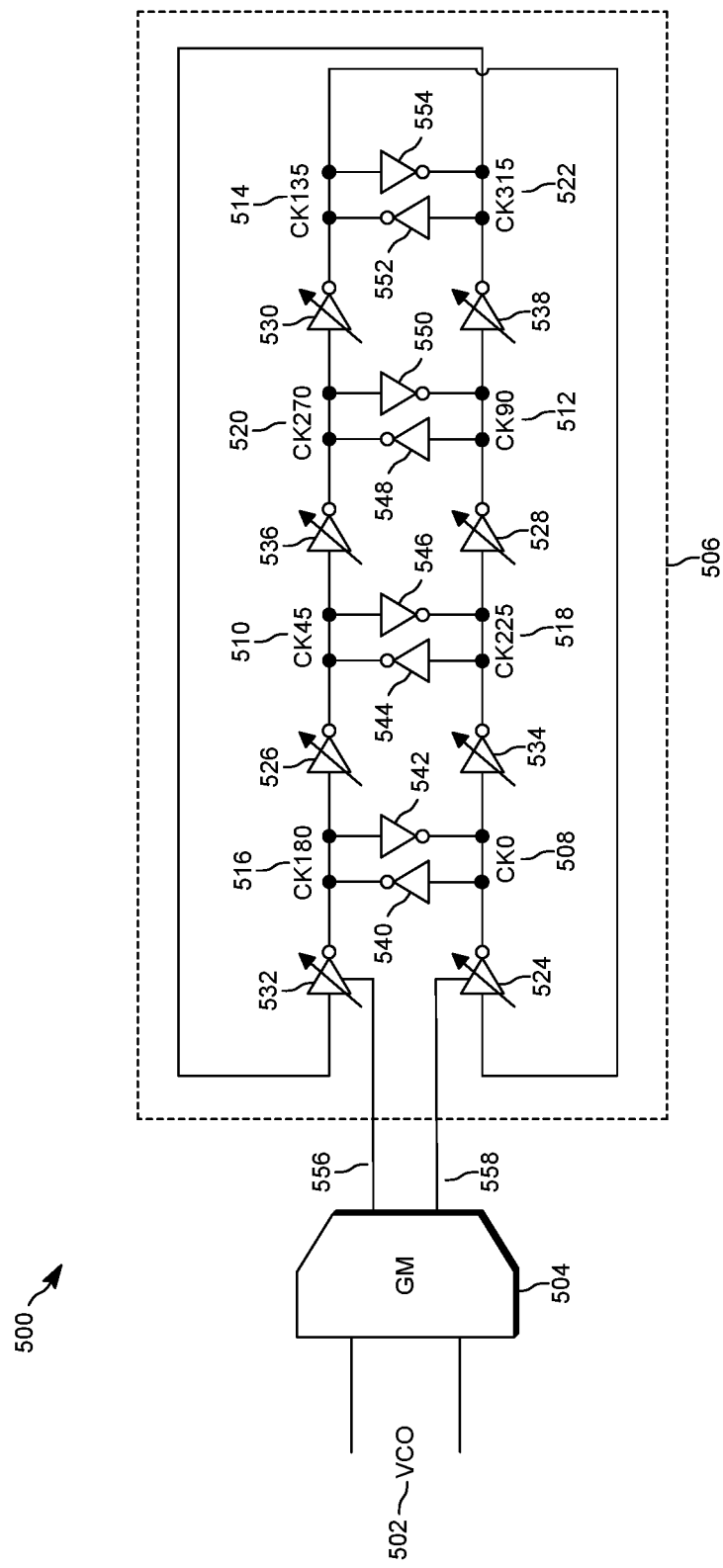
FIG. 5 is a schematic illustration showing an example injection-locked ring oscillator (ILRO) quadrature circuit according to some embodiments.

FIG. 5 is a schematic illustration 500 showing an example injection-locked ring oscillator (ILRO) quadrature circuit according to some embodiments. For some embodiments, one or more voltage-controlled oscillator (VCO) signals 502 may be inputted into a transconductance ($g_m$) signal conditioning circuit 504, or transconductance amplifier 504. The circuit 504 serves to inject an output signal from the VCO or DCO (e.g. DCO 402 of FIG. 4 or DCO circuit 302 of FIG. 3) into the ILRO 506 as a pair of output signals 556, 558. Some embodiments of the transconductance ($g_m$) signal conditioning circuit 504 may convert the VCO voltage signal pair 502 into a voltage and current signal or a current signal (e.g., as output signals 556, 558). The VCO signal pair 502 may be a phase signal pair with one signal having, for example, a phase of 0 degrees and the other signal having a phase of 180 degrees. In some embodiments, complementary phase pair signals 556, 558 enter the example ILRO quadrature circuit 506 at dedicated signal inputs to respective adjustable delay inverters 532, 524. A pair of inverter outputs CK0 and CK180 (508, 516) are connected with inverter pairs 540, 542. If the CK0 signal 508 switches state, the inverter pairs 540, 542 may cause the CK180 signal 516 to switch state and vice versa. A similar operation occurs for a set of adjustable delay inverter outputs CK45 (510), CK90 (512), CK135 (514), CK225 (518), CK270 (520), CK315 (522) and a corresponding set of respective inverter pairs 544, 546, 548, 550, 552, 554. The ILRO 506 as shown in FIG. 5 is arranged so that one ILRO feedback connects between the CK315 adjustable delay inverter output 522 to the opposite side adjustable delay inverter 524. Likewise, a second ILRO feedback connects between the CK135 adjustable delay inverter output 514 to the opposite side adjustable delay inverter 532. In some embodiments, there may be no "cross" feedback of inverter outputs as shown in the example of FIG. 5. For example, in some embodiments, rather than a ring oscillator (e.g., implemented as an ILRO) with an even number of inverter stages (here N=4 adjustable delay inverters in each path), a ring oscillator (e.g., implemented as an ILRO) with an odd number of inverters (e.g., N=3 in each path) may be used, in which case the signal may generally be fed back directly to the first inverter stage in the path of inverter stages.

With some embodiments, generating a set of phase signals may include generating, from the pair of voltage-controlled oscillator signals 502, the set of phase signal pairs 508, 510, 512, 514, 516, 518, 520, 522. The set of phase signal pairs may be generated by a ring oscillator, such as the ILRO 506, as shown in FIG. 5. Although a VCO signal pair 502 is described in FIG. 5 as an example of, e.g., a digitally-controlled oscillator (DCO) signal pair, in some embodiments an ICO (current controlled oscillator) signal pair may be used. The phase generation circuit 306 of FIG. 3 may include an ILRO, such as the one shown in FIG. 5. A phase generation circuit (such as the ILRO 506 of FIG. 5) may be configured to generate, from the pair of voltage-controlled oscillator signals 502 (e.g., as output signals 556, 558 from circuit 504), the set of phase signal pairs 508, 510, 512, 514, 516, 518, 520, 522, and elements (such as adjustable-delay inverters 524, 526, 528, 530, 532, 534, 536, 538) of the phase circuit generating the set of phase signal pairs 508, 510, 512, 514, 516, 518, 520, 522 may be arranged in a ring oscillator configuration. For some embodiments, elements (such as adjustable-delay inverters 524, 526, 528, 530, 532, 534, 536, 538) generating a set of phase signal pairs may be separated by inverter pairs (such as inverter pairs 540, 542, 544, 546, 548, 550, 552, 554 of FIG. 5). Such inverter pairs 540, 542, 544, 546, 548, 550, 552, 554 may be used to align a plurality of phases (such as the set of adjustable delay inverter outputs CK0 (508), CK45 (510), CK90 (512), CK135 (514), CK180 (516), CK225 (518), CK270 (520), and CK315 (522)) of a phase-modulated carrier output signal. It will be understood that these are merely examples and other implementations are possible in accordance with some embodiments, and that in some cases merely a subset of the phase signal pairs that may be generated in an example implementation of a phase generation circuit (including, e.g., an ILRO circuit) may be utilized in subsequent processing, such as a non-integer fractional divider such as divide-by-1.25 circuit 406 of FIG. 4.

For some embodiments, an oscillation frequency of the ILRO 506 may be tuned to be substantially-near a carrier center frequency of a phase-modulated carrier output signal with the carrier center frequency. In some embodiments, the ILRO 506 may be coupled to the output of a DCO circuit, a VCO circuit, or the transconductance ($g_m$) signal conditioning circuit 504. An injection circuit (such as the transconductance ($g_m$) signal conditioning circuit 504) may inject the phase-modulated signal into the ILRO to generate a plurality of phases of the phase-modulated signal (such as the phase signals CK0 (508), CK90 (512), CK180 (516), and CK270 (520)) in some embodiments. Other sets of phase signals may be generated, such as CK0 (508), CK45 (510), CK90 (512), CK135 (514), CK180 (516), CK225 (518), CK270 (520), and CK315 (522). For some embodiments, the transconductance ($g_m$) signal conditioning circuit 504 may inject a phase-modulated signal with phases of 0 degrees and 180 degrees into the ILRO 506.

Figure 6:
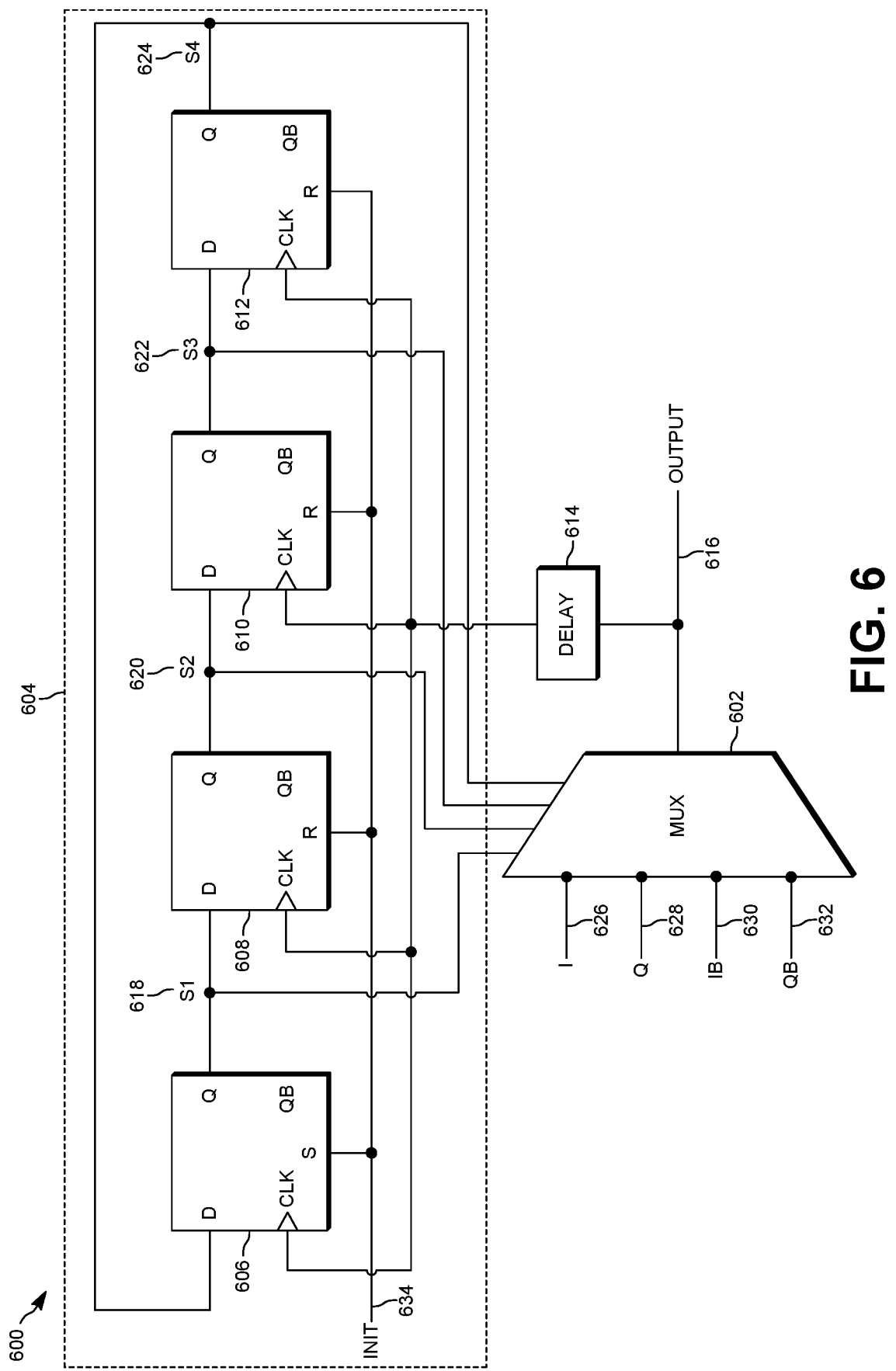
FIG. 6 is a schematic illustration showing an example circuit for generating a fractional frequency output signal according to some embodiments.

FIGS. 6 and 7 are complementary figures that will be described together. FIG. 6 is a schematic illustration showing an example circuit 600 for generating a fractional frequency output signal according to some embodiments. FIG. 7 is a timing diagram 700 showing example relative timing relationships for phase input signals and a fractional frequency output signal according to some embodiments. In some embodiments, the circuit shown in FIG. 6 may correspond to, and serve as an example implementation of, the divide-by-1.25 circuit 406 of FIG. 4.

For some embodiments, a multiplexer (MUX), such as a MUX 602 of FIG. 6, may be used to sequentially select successive phases of a plurality of phases of a phase-modulated signal (such as phase signals I 626, Q 628, IB 630, and QB 632) to provide a fractional frequency output signal 616 having a center frequency equal to the carrier center frequency divided by a (here non-integer) carrier frequency divisor. For example, the carrier frequency divisor may be 1.25 in some embodiments. In some embodiments, the carrier frequency divisor may be equal to a phase skip count divided by a phase count. For instance, the phase count may be 4, such as shown in FIG. 6 with four phase signals 626, 628, 630, 632 injected into the MUX 602. The phase skip count may be 5 to generate a fractional frequency output signal with a center frequency equal to the carrier center frequency divided by 5/4 or 1.25.

Some embodiments of the fractional frequency division circuit 308 of FIG. 3 may be as shown in FIG. 6, with the phase generation circuit 306 of FIG. 3 outputting a set of phase signals of the modulated carrier signal, such as signals with phase offsets of 0, 90, 180, and 270 degrees. The set of phase signals 626, 628, 630, 632 (which may correspond to the signals with phase offsets of 0, 90 180, and 270 degrees) may be received by the multiplexer (MUX) 602. Select signals 618, 620, 622, 624 for the MUX 602 are connected to outputs of a set of D-Flip-Flops 606, 608, 610, 612. The D-Flip-Flops 606, 608, 610, 612 may be arranged in a ring configuration 604 that enable a series of states to be repeated and cycled through. In some embodiments, the multiplexer selection ring oscillator 604 may be coupled to the multiplexer 602. The phase signals 626, 628, 630, 632, which are labeled as I, Q, IB, and QB respectively, may correspond to timing signals I 702, Q 704, IB 706, and QB 708 of FIG. 7. Select signals S1 618, S2 620, S3 622, and S4 624 of the MUX 602 may correspond to timing diagram signals S1 712, S2 714, S3 716, and S4 718 of FIG. 7. The fractional frequency output signal 616 may correspond to a timing diagram output signal 720 of FIG. 7. Also, the initialization signal 634 of FIG. 6 may correspond to initialization signal 710 of FIG. 7. A delay element 614 may be inserted between the fractional frequency output signal 616 and the clock inputs to the D-Flip-Flops 606, 608, 610, 612.

For some embodiments, the initialization signal 634 may be configured to hold the first D-Flip-Flop 606 in a set state (which may occur by setting an "S" pin in a high state) and the second, third and fourth D-Flip-Flops 608, 610, 612 in a reset state (which may occur by setting an "R" pin in a high state). As a result, the Q pin output signals (S1 618, S2 620, S3 622, and S4 624) may be equal to 1, 0, 0, 0, respectively, while the initialization signal 634 is high. The left side of FIG. 7 shows the initialization signal 710 in a high (or "1") state while the S1 712 is high and the S2 714, S3 716, and S4 718 are low. Initializing the select signals S1 618, S2 620, S3 622, S4 624 to the 1, 0, 0, 0 state causes the MUX 602 to select the I signal 626 for the fractional frequency output signal 616. FIG. 7 shows the output signal 720 equal to the I signal 702 while the initialization signal 710 is high. To aid in understanding the timing diagram of FIG. 7, the source of the MUX output signal 720 is shown with dotted lines for the corresponding portion of the I 702, Q 704, IB 706, and QB 708 signals.

As shown in FIG. 7, the initialization signal 710 may be equal to a high (or "1") state long enough to enable the D-Flip-Flops 606, 608, 610, 612 to initialize the outputs (S1 618, S2 620, S3 622, and S4 624) to the 1, 0, 0, 0 state. The fractional frequency output signal 616 may be connected to the D-Flip-Flop clock signals via the delay element 614. With the initialization signal 634, 710 high, the MUX 602 initializes to select the I signal 626, 702 as the fractional frequency output signal 616, 720. As the initialization signal 634, 710 first goes low, the D signal input (which is connected to the S4 signal 624) of the first D-Flip-Flop 606 is equal to 0 while the Q signal output (which is connected to the S1 signal 618) is equal to 1. Hence, the first D-Flip-Flop 606 waits for the clock signal to go high before changing the state of the corresponding Q signal output 618. For some embodiments, the D-Flip-Flop clock signals may be delayed versions of the fractional frequency output signal 616, 720. FIG. 7 shows a delay between the output signal 720 going high and the S1 712, S2 714, S3 716, and S4 718 signals changing states. The dashed arrows of FIG. 7 indicate the point at which the applicable MUX input signal (which is equal to the output signal 720 at those points in time) goes high and eventually leads the point at which the MUX select signals S1 712, S2 714, S3 716, and S4 718 signals change states.

For example, the I signal 626, 702 may be a 50% duty cycle signal that is one of the inputs to the MUX 602. The I signal 626, 702 may correspond to a modulator input signal with a phase of 0 degrees. The Q 628, 704, IB 630, 706, and QB 632, 708 signals may correspond to phases of 90, 180, and 270 degrees, respectively. With the I signal 626, 702 equal to a 50% duty signal that corresponds to a 0 degree phase, the Q signal 628, 704 may correspond to a 90 degree phase and may be a quarter cycle delayed version of the I signal 626, 702. Likewise, the IB signal 630, 706 may correspond to a 180 degree phase and may be a half cycle delayed version of the I signal 626, 702. The QB signal 632, 708 may correspond to a 270 degree phase and may be a three quarters cycle delayed version of the I signal 626, 702 (or a half cycle delayed version of the Q signal 628, 704). The changes in the MUX select signals S1 (618, 712), S2 (620, 714), S3 (622, 716), and S4 (624, 718) cause changes in the source of the MUX output signal 720. For MUX input signals that are quarter cycle delayed versions of each other, changing the MUX select signals S1 (618, 712), S2 (620, 714), S3 (622, 716), and S4 (624, 718) may cause the MUX output signal 720 to insert quarter cycle delays. For MUX input signals I (626, 702), Q (628, 704), IB (630, 706), and QB (632, 708) with a 50% duty cycle and quarter cycle delays between each signal, the fractional frequency output signal 616, 720 may have a 40% duty cycle as shown in FIG. 7. In some embodiments, receiving a 50% duty cycle input signal and outputting a 40% duty cycle output signal may correspond to dividing a phase-modulated carrier output signal's carrier center frequency by 1.25. For some embodiments, the MUX input signals I (626, 702), Q (628, 704), IB (630, 706), and QB (632, 708) may correspond to the 4 phase signals that are inputs to the divide-by-1.25 circuit 406 of FIG. 4.

For some embodiments, selecting portions of the set of phase signals 626, 702, 628, 704, 630, 706, 632, 708 may be a repeating process for generating a series of signals that includes: selecting a first phase signal 626, 702 as a first portion of the fractional frequency output signal 616, 720; responsive to detecting a rising edge of the first phase signal 626, 702, selecting a second phase signal 628, 704 as a second portion of the fractional frequency output signal 616, 720; responsive to detecting a rising edge of the second phase signal 628, 704, selecting a third phase signal 630, 706 as a third portion of the fractional frequency output signal 616, 720; responsive to detecting a rising edge of the third phase signal 630, 706, selecting a fourth phase signal 632, 708 as a fourth portion of the fractional frequency output signal 616, 720; and responsive to detecting a rising edge of the fourth phase signal 632, 708, repeating the process for generating the series of signals. With some embodiments, a fractional frequency division circuit (such as the circuit shown in FIG. 6) may be configured to perform a repeating process for generating the series of phase signals.

With some embodiments, sequentially selecting successive phases of the plurality of phases (of a phase-modulated carrier output signal) may include repeating a sequential process of responsively detecting a rising edge of a current phase signal (such as a rising edge of the I signal 702) and selecting a next phase signal (such as shown by dashed arrows 722, 724, 726, 728, 730, 732 of FIG. 7 for successive selections) for a next portion of the fractional frequency output signal. For example, the rising edge of the I signal 702 may trigger a delayed selection of the next phase signal (such as the Q signal 704). The next phase signal may become the current phase signal upon selection. For example, the falling edge of the S1 712 signal and corresponding rising edge of the S2 714 signal may cause the output signal 720 to switch sources from the I signal 702 to the Q signal 704, which are highlighted by dotted signals in FIG. 7. For some embodiments, the current phase signal may be delayed prior to detecting the rising edge of the current phase signals. For example, the delay element 614 may be located between the fractional frequency output signal 616 (which may be equal to the current phase signal) and the clock input pins of the D flip-flops 606, 608, 610, 612 that may be used to detect rising edges.

Some embodiments for selecting portions of the set of phase signals 626, 702, 628, 704, 630, 706, 632, and 708 may include using the multiplexer selection ring oscillator 604 and may include initializing each element (or a set of states) in the multiplexer selection ring oscillator 604 and indicating a completion of initialization of the multiplexer selection ring oscillator 604 using a state change of the modulator input signal (such as the low to high transition of the I signal 702 triggering 734 the initialization line 710 to go low).

FIG. 8 is a flowchart 800 illustrating an example process for generating a fractional frequency output signal according to some embodiments. Example systems and methods may implement an example process in accordance with some embodiments, where the example process may include: receiving 802, from a modulator, a phase-modulated carrier output signal having a carrier center frequency that is a non-integer multiple of a desired carrier center frequency; generating 804, by an injection-locked ring oscillator (ILRO), a plurality of phases of the phase-modulated carrier output signal at a plurality of outputs of the ILRO; generating 806 a decoupled fractional frequency output signal by sequentially selecting, using a multiplexer (MUX), successive outputs of the plurality of outputs corresponding to successive phases of the plurality of phases, the decoupled fractional frequency output signal having a center frequency equal to an integer multiple of the desired carrier center frequency; and generating 808, based on the decoupled fractional frequency output signal, a desired phase-modulated carrier output signal that is decoupled from the modulator, the desired phase-modulated carrier output signal having a generated carrier center frequency equal to the desired carrier center frequency.

Figure 9:
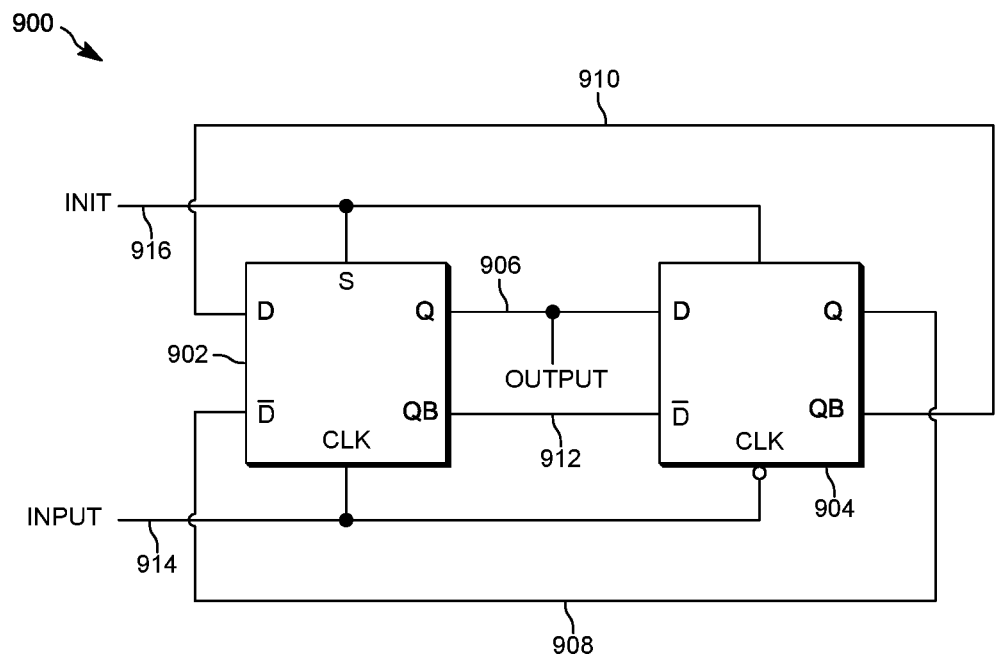
FIG. 9 is a schematic illustration showing an example circuit for dividing a carrier center frequency by 2 according to some embodiments.
Figure 10:
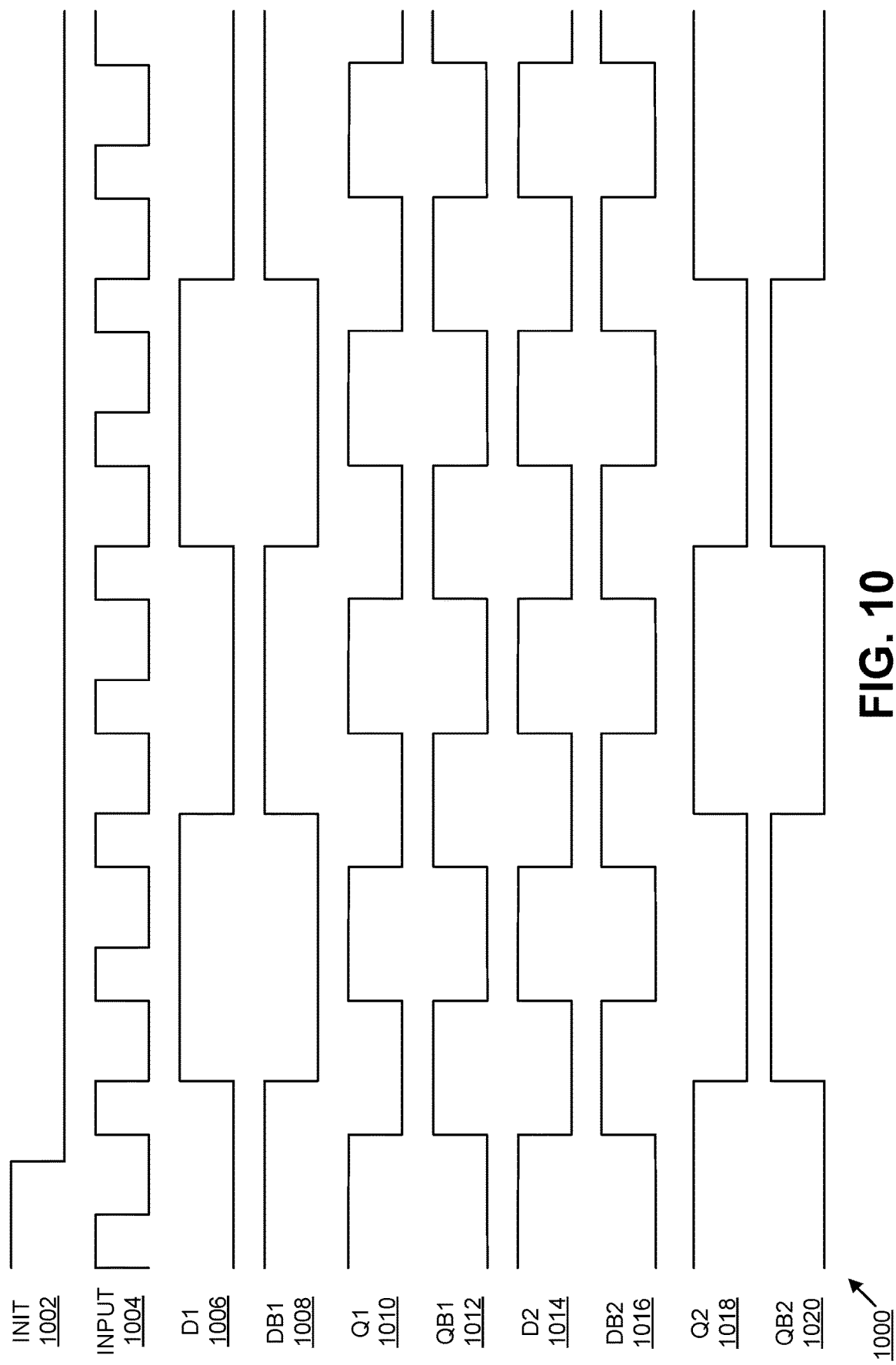
FIG. 10 is a timing diagram showing example relative timing relationships for phase signals and a divide-by-2 circuit output signal according to some embodiments.

FIGS. 9 and 10 are complementary figures that will be described together. FIG. 9 is a schematic illustration 900 showing an example circuit for dividing a carrier center frequency by 2 according to some embodiments. FIG. 10 is a timing diagram 1000 showing example relative timing relationships for phase signals and a divide-by-2 circuit output signal according to some embodiments. In some embodiments, the circuit shown in FIG. 9 may correspond to, and serve as an example implementation of, the divide-by-2 circuit 408 of FIG. 4.

For some embodiments, an initialization signal 916 of FIG. 9 may correspond to an initialization signal 1002 of FIG. 10. An input signal 914 of FIG. 9 may correspond to an input signal 1004 of FIG. 10. A set of D 910, DB 908, Q 906, QB 912, and CLK 914 signals of first D-Flip-Flop 902 of FIG. 9 may correspond to a set of D1 1006, DB1 1008, Q1 1010, QB1 1012, and INPUT 1004 signals of FIG. 10. The set of D 906, DB 912, Q 908, QB 910, and CLK 914 signals of second D-Flip-Flop 904 of FIG. 9 may correspond to a set of D2 1014, DB2 1016, Q2 1018, QB2 1020, and INPUT 1004 signals of FIG. 10.

The initialization signal 1002 of FIG. 10 may be equal to a high (or "1") state to initialize the Q1 1010 and the Q2 1018 signals to a high state, which may initialize the first D-Flip-Flop's Q signal 906 (Q1 1010) and the second D-Flip-Flop's Q signal 908 (Q2 1018) to a high state. With the falling edge of the initialization signal 916, 1002, the first and second D-Flip-Flops 902, 904 trigger Q signal output state changes upon rising and falling edges, respectively, of the INPUT signal 914, 1004.

A series of states for the Q1 1010, 906 and Q2 1018, 908 output signals may repeat for some embodiments. Upon the rising edge of the INPUT signal with the INIT signal 1002 equal to a low state, the Q1 1010, 906 signal changes from high to low to match D1 1006, 910. Upon the next falling edge of the INPUT signal 1004, 914, the Q2 signal 1018, 908 changes from high to low to match the D2 signal 1014, 906. Upon the next rising edge of the INPUT signal 1004, 914, the Q1 signal 1010, 906 changes from low to high to match the D1 signal 1006, 910. The next falling edge of the INPUT signal 1004, 914 causes the Q2 signal 1018, 908 to change from low to high to match the D2 signal 1014, 906. With some embodiments, the input signal 914, 1004 with a 40% duty cycle may injected into the divide-by-2 circuit 900, and the output signal (Q1) 906, 1010 may be generated with a 50% duty cycle and a carrier center frequency that is half the carrier center frequency of the input signal 914, 1004, such as the example shown in FIG. 10.

Figure 11:
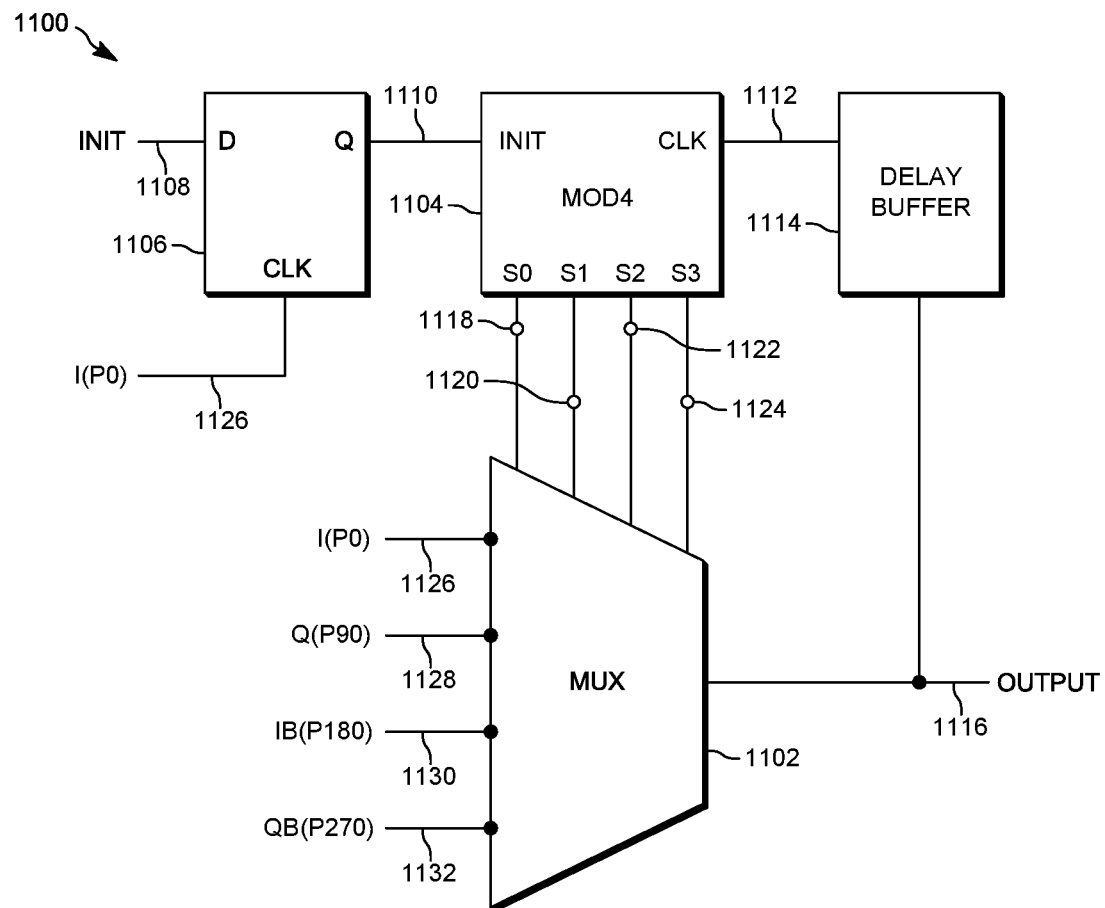
FIG. 11 is a schematic illustration showing an example circuit for generating a fractional frequency output signal according to some embodiments.

FIG. 11 is a schematic illustration showing an example circuit for generating a fractional frequency output signal according to some embodiments. In some embodiments, the circuit shown in FIG. 11 may correspond to the divide-by-1.25 circuit 406 of FIG. 4.

Some embodiments of the fractional frequency division circuit 308 of FIG. 3 may be as shown in the circuit 1100 of FIG. 11. A set of phase signals 1126, 1128, 1130, 1132 may be received by a multiplexer (MUX) 1102. Select signals 1118, 1120, 1122, 1124 for the MUX 1102 are connected to a set of outputs S0, S1, S2, S3 of a modulo 4 (MOD4) counter 1104. The MOD4 counter may operate such that a series of states are repeated for the S0, S1, S2, S3 outputs. The phase signals 1126, 1128, 1130, 1132, which are labeled as I, Q, IB, and QB respectively, may correspond to the timing signals I 702, Q 704, IB 706, and QB 708 of FIG. 7. The select signals S0 1118, S1 1120, S2 1122, and S3 1124 of the MUX 1102 may correspond to timing diagram signals S1 712, S2 714, S3 716, and S4 718 of FIG. 7. An output signal 1116 of the MUX 1102 may correspond to timing diagram output signal 720 of FIG. 7. Also, the initialization signal 1108 of FIG. 11 may correspond to initialization signal 710 of FIG. 7. A delay element 1114 may be inserted between the MUX output 1116 and a clock input 1112 to the MOD4 counter 1104.

For some embodiments, an initialization signal 1108 may be injected into a D-Flip-Flop 1106. The D-Flip-Flop 1106 outputs a Q signal 1110, which may be connected to an initialization pin of the MOD4 counter 1104 to initialize the MOD4 counter 1104 to the counter output signals (S0 1118, S1 1120, S2 1122, and S3 1124) equal to 1, 0, 0, 0, respectively, while the initialization signal 1108 is high. Initializing the select signals S0 1118, S1 1120, S2 1122, S3 1124 equal to 1000 may cause the MUX 1102 to select the I (P0) signal 1126 for the MUX output signal 1116.

As shown in FIG. 7, the initialization signal 710 (which may correspond to the D-flip-flop's initialization signal 1108 for some embodiments) may be equal to a high (or "1") state long enough to enable the MOD4 counter 1104 of FIG. 11 to initialize the outputs (S0 1118, S1 1120, S2 1122, and S3 1124) to the 1, 0, 0, 0 state. The MUX output 1116 may be connected to the MOD4 counter's clock signal 1112 via the delay element 1114. With the initialization signal 1108, 710 high, the MUX 1102 initializes to select the I signal (P0) 1126, 702 as the output signal 1116, 720. For some embodiments, the MOD4 counter's clock signal 1112 is a delayed version of the MUX output signal 1116. Hence, each rising edge of the MUX output signal 1116 may cause a delayed rising edge of the MOD4 counter clock signal 1112. For example, the delay buffer 1114 may cause a quarter cycle delay in a rising edge of the MUX output signal 1116 and the respective rising edge of the MOD4 counter's clock signal 1112.

For example, the I signal 1126, 702 may be a 50% duty cycle signal that is one of the inputs to the MUX 1102. The I signal 1126, 702 may correspond to a modulator input signal with a phase of 0 degrees. The Q 1128, 704, IB 1130, 706, and QB 1132, 708 signals may correspond to phases of 90, 180, and 270 degrees, respectively. With the I signal 1126, 702 equal to a 50% duty signal that corresponds to a 0 degree phase, the Q signal 1128, 704 may correspond to a 90 degree phase and may be a quarter cycle delayed version of the I signal 1126, 702. Likewise, the IB signal 1130, 706 may correspond to a 180 degree phase and may be a half cycle delayed version of the I signal 1126, 702. The QB signal 1132, 708 may correspond to a 270 degree phase and may be a three quarters cycle delayed version of the I signal 1126, 702. The changes in the MUX select signals S0 (1118), S1 (1120), S2 (1122), and S3 (1124) cause changes in the source of the MUX output signal 1116. For the MUX input signals I (1126, 702), Q (1128, 704), IB (1130, 706), and QB (1132, 708) with a 50% duty cycle and quarter cycle delays between each signal, the MUX output signal 1116, 720 may have a 40% duty cycle as shown in FIG. 7. Receiving a 50% duty cycle input signal and outputting a 40% duty cycle output signal may correspond for some embodiments to dividing a phase-modulated carrier output signal's carrier center frequency by 1.25. For some embodiments, the MUX input signals I (1126, 702), Q (1128, 704), IB (1130, 706), and QB (1132, 708) may correspond to the 4 phase signals that are inputs to the divide-by-1.25 circuit 406 of FIG. 4.

An example method disclosed herein in accordance with some embodiments may include: receiving, from a modulator, a phase-modulated carrier output signal having a carrier center frequency that is a non-integer multiple of a desired carrier center frequency; generating, by an injection-locked ring oscillator (ILRO), a plurality of phases of the phase-modulated carrier output signal at a plurality of outputs of the ILRO; generating a decoupled fractional frequency output signal by sequentially selecting, using a multiplexer, successive outputs of the plurality of outputs corresponding to successive phases of the plurality of phases, the decoupled fractional frequency output signal having a center frequency equal to an integer multiple of the desired carrier center frequency; and generating, based on the decoupled fractional frequency output signal, a desired phase-modulated carrier output signal that is decoupled from the modulator, the desired phase-modulated carrier output signal having a generated carrier center frequency equal to the desired carrier center frequency.

According to the example method, in some embodiments, an oscillation frequency of the ILRO may be tuned to be substantially-near the carrier center frequency of the phase-modulated carrier output signal.

According to the example method, in some embodiments, generating the plurality of phases may further include tuning an oscillation frequency of the ILRO to be substantially near the carrier center frequency.

According to the example method, in some embodiments, generating the plurality of phases may further include injecting, by an injection circuit coupled to the ILRO, the phase-modulate carrier output signal into the ILRO.

The example method may further include, in some embodiments, transmitting the desired phase-modulated carrier output signal having the generated carrier center frequency equal to the desired carrier center frequency.

According to the example method, in some embodiments, the carrier center frequency of the phase-modulated carrier output signal may be 1.25 times the center frequency of the decoupled fractional frequency output signal.

According to the example method, in some embodiments, receiving the phase-modulated carrier output signal may include receiving phase-modulated carrier signals with phases of 0 degrees and 180 degrees.

According to the example method, in some embodiments, generating, by the ILRO, the plurality of phases of the phase-modulated carrier output signal generates phases of 0, 90, 180, and 270 degrees.

The example method may further include, in some embodiments, aligning the plurality of phases of the phase-modulated carrier output signal into a plurality of pairs of phases.

According to the example method, in some embodiments, generating the desired phase-modulated carrier output signal based on the decoupled fractional frequency output signal may include: dividing by 2 the center frequency of the decoupled fractional frequency output signal.

Further according to the example method, in some embodiments, dividing by 2 the center frequency of the decoupled fractional frequency output signal may include: triggering a divide-by-2 output signal to go high upon a rising edge of the decoupled fractional frequency output signal; and resetting the divide-by-2 output signal to low after an adjustable period of time, wherein a center frequency of the divide-by-2 output signal may be half the center frequency of the decoupled fractional frequency output signal.

According to the example method, in some embodiments, sequentially selecting successive outputs of the plurality of outputs corresponding to successive phases of the plurality of phases may include repeating a sequential process that may include: responsive to detecting a rising edge of a current phase of the plurality of phases, selecting a portion of a next phase of the plurality of phases; setting a next portion of the decoupled fractional frequency output signal equal to the selected portion of the next phase; and setting the current phase equal to the next phase.

Further according to the example method, in some embodiments, the sequential process may further include delaying the current phase prior to detecting the rising edge of the current phase.

An example apparatus disclosed herein in accordance with some embodiments may include: a digitally-controlled oscillator (DCO) circuit configured to output a phase-modulated carrier output signal having a carrier center frequency that is a non-integer multiple of a desired carrier center frequency; an injection-locked ring oscillator (ILRO) configured to generate a plurality of phases of the phase-modulated carrier output signal at a plurality of outputs of the ILRO; and a fractional frequency division circuit coupled to the plurality of outputs of the ILRO, the fractional frequency division circuit configured to sequentially-select, using a multiplexer (MUX), successive outputs of the plurality of outputs corresponding to successive phases of the plurality of phases to generate a decoupled fractional frequency output signal having a center frequency equal to an integer multiple of the desired carrier center frequency.

According to the example apparatus, in some embodiments, the ILRO may be configured such that an oscillation frequency of the ILRO is tuned to be substantially-near the carrier center frequency of the phase-modulated carrier output signal.

The example apparatus may further include, in some embodiments, an injection circuit coupled to the ILRO and to an output of the DCO circuit and configured to inject the phase-modulate carrier output signal into the ILRO.

The example apparatus may further include, in some embodiments, an integer frequency division circuit coupled to the fractional frequency division circuit and configured to generate, based on the decoupled fractional frequency output signal, a desired phase-modulated carrier output signal that is decoupled from the DCO circuit, the desired phase-modulated carrier output signal having a generated carrier center frequency equal to the desired carrier center frequency.

Further according to the example apparatus, in some embodiments, the integer frequency division circuit may be further configured to generate the desired phase-modulated carrier output signal based on the decoupled fractional frequency output signal by dividing by 2 the center frequency of the decoupled fractional frequency output signal. In some embodiments, the integer frequency division circuit may be further configured to trigger an integer frequency division output signal to go high upon a rising edge of the decoupled fractional frequency output signal. In some embodiments, the integer frequency division circuit may be further configured to reset the integer frequency division output signal to low after an adjustable period of time. In some embodiments, a center frequency of the integer frequency division output signal may be equal to half the center frequency of the fractional frequency output signal.

Further according to the example apparatus, the example apparatus may further include, in some embodiments, an amplifier configured to amplify the desired phase-modulated carrier output signal for transmission.

According to the example apparatus, in some embodiments, the fractional frequency division circuit may include the MUX and multiple delay flip-flops, the multiple delay flip-flops having respective outputs configured to sequentially select the successive outputs of the plurality of outputs corresponding to successive phases of the plurality of phases.

According to the example apparatus, in some embodiments, the carrier center frequency of the phase-modulated carrier output signal may be 1.25 times the center frequency of the decoupled fractional frequency output signal.

According to the example apparatus, in some embodiments, the DCO circuit may be configured to output the phase-modulated carrier output signal with phases of 0 degrees and 180 degrees.

According to the example apparatus, in some embodiments, the ILRO may be further configured to generate the phases of 0, 90, 180, and 270 degrees of the phase-modulated carrier output signal.

According to the example apparatus, in some embodiments, the fractional frequency division circuit may be further configured to align the plurality of phases of the phase-modulated carrier output signal into a plurality of pairs of phases.

According to the example apparatus, in some embodiments, the fractional frequency division circuit may be configured to repeat a sequential process including: responsive to detecting a rising edge of a current phase of the plurality of phases, selecting a portion of a next phase of the plurality of phases; setting a next portion of the decoupled fractional frequency output signal equal to the selected portion of the next phase; and setting the current phase equal to the next phase.

Further according to the example apparatus, the example apparatus may further include, in some embodiments, a delay element coupled to the fractional frequency division circuit and configured to delay the current phase prior to detecting the rising edge of the current phase.

Another example apparatus disclosed herein in accordance with some embodiments may include: a processor; and a non-transitory computer-readable medium storing instructions that are operative, when executed by the processor, to perform the functions including: receiving, from a modulator, a phase-modulated carrier output signal having a carrier center frequency that is a non-integer multiple of a desired carrier center frequency; generating, by an injection-locked ring oscillator (ILRO) a plurality of phases of the phase-modulated carrier output signal at a plurality of outputs of the ILRO; generating a decoupled fractional frequency output signal by sequentially selecting, using a multiplexer, successive outputs of the plurality of outputs corresponding to successive phases of the plurality of phases, the decoupled fractional frequency output signal having a center frequency equal to an integer multiple of the desired carrier center frequency; and generating, based on the decoupled fractional frequency output signal, a desired phase modulated carrier output signal that is decoupled from the modulator, the desired phase-modulated carrier output signal having a generated carrier center frequency equal to the desired carrier center frequency.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed:

1. A method comprising:
receiving, from a modulator, a phase-modulated carrier output signal having a carrier center frequency that is a non-integer multiple of a desired carrier center frequency;
generating, by an injection-locked ring oscillator (ILRO), a plurality of phases of the phase-modulated carrier output signal at a plurality of outputs of the ILRO;
generating a decoupled fractional frequency output signal by sequentially selecting, using a multiplexer, successive outputs of the plurality of outputs corresponding to successive phases of the plurality of phases, the decoupled fractional frequency output signal having a center frequency equal to an integer multiple of the desired carrier center frequency; and
generating, based on the decoupled fractional frequency output signal, a desired phase-modulated carrier output signal that is decoupled from the modulator, the desired phase-modulated carrier output signal having a generated carrier center frequency equal to the desired carrier center frequency.

2. The method of claim 1, further comprising:
transmitting the desired phase-modulated carrier output signal having the generated carrier frequency equal to the desired carrier center frequency, and
wherein an oscillation frequency of the ILRO is tuned to be substantially-near the carrier center frequency of the phase-modulated carrier output signal.

3. The method of claim 1, wherein generating the plurality of phases further comprises:
tuning an oscillation frequency of the ILRO to be substantially-near the carrier center frequency.

4. The method of claim 1, wherein generating the plurality of phases further comprises:

injecting, by an injection circuit coupled to the ILRO, the phase-modulated carrier output signal into the ILRO.

5. The method of claim 1, wherein the carrier center frequency of the phase-modulated carrier output signal is 1.25 times the center frequency of the decoupled fractional frequency output signal.

6. The method of claim 1, wherein receiving the phase-modulated carrier output signal comprises receiving phase-modulated carrier signals with phases of 0 degrees and 180 degrees.

7. The method of claim 1, wherein generating, by the ILRO, the plurality of phases of the phase-modulated carrier output signal generates phases of 0, 90, 180, and 270 degrees.

8. The method of claim 1, further comprising:
aligning the plurality of phases of the phase-modulated carrier output signal into a plurality of pairs of phases.

9. The method of claim 1, wherein generating the desired phase-modulated carrier output signal based on the decoupled fractional frequency output signal comprises: dividing by 2 the center frequency of the decoupled fractional frequency output signal.

10. The method of claim 9, wherein dividing by 2 the center frequency of the decoupled fractional frequency output signal comprises:
triggering a divide-by-2 output signal to go high upon a rising edge of the decoupled fractional frequency output signal; and
resetting the divide-by-2 output signal to low after an adjustable period of time,
wherein a center frequency of the divide-by-2 output signal is half the center frequency of the decoupled fractional frequency output signal.

11. The method of claim 1, wherein sequentially selecting successive outputs of the plurality of outputs corresponding to successive phases of the plurality of phases comprises repeating a sequential process that comprises:
responsive to detecting a rising edge of a current phase of the plurality of phases, selecting a portion of a next phase of the plurality of phases;
setting a next portion of the decoupled fractional frequency output signal equal to the selected portion of the next phase; and
setting the current phase equal to the next phase.

12. The method of claim 11, wherein the sequential process further comprises delaying the current phase prior to detecting the rising edge of the current phase.

13. An apparatus comprising:
a digitally-controlled oscillator (DCO) circuit configured to output a phase-modulated carrier output signal having a carrier center frequency that is a non-integer multiple of a desired carrier center frequency;
an injection-locked ring oscillator (ILRO) configured to generate a plurality of phases of the phase-modulated carrier output signal at a plurality of outputs of the ILRO; and
a fractional frequency division circuit coupled to the plurality of outputs of the ILRO, the fractional frequency division circuit configured to sequentially-select, using a multiplexer (MUX), successive outputs of the plurality of outputs corresponding to successive phases of the plurality of phases to generate a decoupled fractional frequency output signal having a center frequency equal to an integer multiple of the desired carrier center frequency.

14. The apparatus of claim 13, wherein the ILRO is configured such that an oscillation frequency of the ILRO is tuned to be substantially-near the carrier center frequency of the phase-modulated carrier output signal.

15. The apparatus of claim 13, further comprising:
an injection circuit coupled to the ILRO and to an output of the DCO circuit and configured to inject the phase-modulated carrier output signal into the ILRO; and
an integer frequency division circuit coupled to the fractional frequency division circuit and configured to generate, based on the decoupled fractional frequency output signal, a desired phase-modulated carrier output signal that is decoupled from the DCO circuit, the desired phase-modulated carrier output signal having a generated carrier center frequency equal to the desired carrier center frequency.

16. The apparatus of claim 15, further comprising:
an amplifier configured to amplify the desired phase-modulated carrier output signal for transmission, and
wherein the integer frequency division circuit is configured to generate the desired phase-modulated carrier output signal based on the decoupled fractional frequency output signal by dividing by 2 the center frequency of the decoupled fractional frequency output signal,
wherein the integer frequency division circuit is further configured to trigger an integer frequency division output signal to go high upon a rising edge of the decoupled fractional frequency output signal and wherein the integer frequency division circuit is further configured to reset the integer frequency division output signal to low after an adjustable period of time, and
wherein a center frequency of the integer frequency division output signal is equal to half the center frequency of the fractional frequency output signal.

17. The apparatus of claim 13, wherein the fractional frequency division circuit comprises the MUX and multiple delay flip-flops, the multiple delay flip-flops having respective outputs configured to sequentially select the successive outputs of the plurality of outputs corresponding to successive phases of the plurality of phases.

18. The apparatus of claim 13,
wherein the carrier center frequency of the phase-modulated carrier output signal is 1.25 times the center frequency of the decoupled fractional frequency output signal,
wherein the DCO circuit is configured to output the phase-modulated carrier output signal with phases of 0 degrees and 180 degrees,
wherein the ILRO is further configured to generate the phases of 0, 90, 180, and 270 degrees of the phase-modulated carrier output signal, and
wherein the fractional frequency division circuit is further configured to align the plurality of phases of the phase-modulated carrier output signal into a plurality of pairs of phases.

19. The apparatus of claim 13, wherein the fractional frequency division circuit is configured to repeat a sequential process comprising:
responsive to detecting a rising edge of a current phase of the plurality of phases, selecting a portion of a next phase of the plurality of phases;
setting a next portion of the decoupled fractional frequency output signal equal to the selected portion of the next phase; and
setting the current phase equal to the next phase, and
wherein the apparatus further comprises:
a delay element coupled to the fractional frequency division circuit and configured to delay the current phase prior to detecting the rising edge of the current phase.

20. An apparatus comprising:
a processor; and
a non-transitory computer-readable medium storing instructions that are operative, when executed by the processor, to perform the functions comprising:
receiving, from a modulator, a phase-modulated carrier output signal having a carrier center frequency that is a non-integer multiple of a desired carrier center frequency;
generating, by an injection-locked ring oscillator (ILRO), a plurality of phases of the phase-modulated carrier output signal at a plurality of outputs of the ILRO;
generating a decoupled fractional frequency output signal by sequentially selecting, using a multiplexer, successive outputs of the plurality of outputs corresponding to successive phases of the plurality of phases, the decoupled fractional frequency output signal having a center frequency equal to an integer multiple of the desired carrier center frequency; and
generating, based on the decoupled fractional frequency output signal, a desired phase-modulated carrier output signal that is decoupled from the modulator, the desired phase-modulated carrier output signal having a generated carrier center frequency equal to the desired carrier center frequency.

* * * * *